United States Patent
Lyden

(10) Patent No.: US 8,957,301 B2
(45) Date of Patent: *Feb. 17, 2015

(54) SOLAR CELL, MODULE, ARRAY, NETWORK, AND POWER GRID

(76) Inventor: Robert Lyden, Aloha, OR (US)

( * ) Notice: Subject to any disclaimer, the term of this patent is extended or adjusted under 35 U.S.C. 154(b) by 905 days.

This patent is subject to a terminal disclaimer.

(21) Appl. No.: 13/027,207

(22) Filed: Feb. 14, 2011

(65) Prior Publication Data

US 2012/0204925 A1   Aug. 16, 2012

(51) Int. Cl.
*H01L 31/00* (2006.01)
*H01L 31/042* (2014.01)
*H01M 10/46* (2006.01)
*H01L 31/02* (2006.01)
*H01L 31/05* (2014.01)
*B60L 11/18* (2006.01)

(52) U.S. Cl.
CPC ........... *H01L 31/042* (2013.01); *H01M 10/465* (2013.01); *H01L 31/02* (2013.01); *H01L 31/02008* (2013.01); *H01L 31/0422* (2013.01); *H01L 31/05* (2013.01); *B60L 11/1816* (2013.01); *B60L 11/1825* (2013.01); *B60L 11/1848* (2013.01); *Y02E 10/50* (2013.01); *B60L 2230/16* (2013.01); *B60L 2230/22* (2013.01); *B60L 2230/30* (2013.01); *B60L 2200/12* (2013.01); *Y02T 10/7088* (2013.01); *Y02T 10/7005* (2013.01); *Y02T 90/16* (2013.01); *Y02T 90/163* (2013.01); *Y02T 90/169* (2013.01); *Y02T 90/121* (2013.01); *Y02T 90/14* (2013.01); *Y02T 90/128* (2013.01); *Y04S 30/14* (2013.01); *B60L 2200/26* (2013.01)

USPC ............ 136/244; 136/251; 320/101; 320/104

(58) Field of Classification Search
USPC ........................... 136/243–293; 320/101, 104
See application file for complete search history.

(56) References Cited

U.S. PATENT DOCUMENTS

| | | | |
|---|---|---|---|
| 3,144,375 A | 8/1964 | Day | |
| 4,855,167 A | 8/1989 | Biehl | |
| 5,522,944 A * | 6/1996 | Elazari | ........................ 136/248 |
| 5,847,537 A * | 12/1998 | Parmley, Sr. | .................. 320/109 |
| 6,111,767 A * | 8/2000 | Handleman | ..................... 363/95 |

\* cited by examiner

*Primary Examiner* — Thanh-Truc Trinh

(57) ABSTRACT

The present invention teaches a solar cell, a solar module, a solar array, a network of solar arrays, and also a solar power grid suitable for providing power for industrial, residential and transportation use. A solar cell or solar module including a plurality of solar cells can be made in a structure configured to have the appearance of natural foliage. Accordingly, a solar array including a plurality of solar modules each including at least one solar cell can be made to resemble a palm tree, a deciduous tree, an evergreen tree, or other type of natural foliage. A network of solar arrays can be made to resemble a row or grove of palm trees, and thus meet the functional and aesthetic demands of landscape architecture. The network of solar arrays can extend for many miles alongside roads, highways, railways, pipelines, or canals, and can further include means for storing and transmitting electric power. In particular, a network of solar arrays can be in communication with recharging stations for use by electric and hybrid transportation vehicles. Accordingly, a network of solar arrays can form at least a portion of a solar power grid.

20 Claims, 23 Drawing Sheets

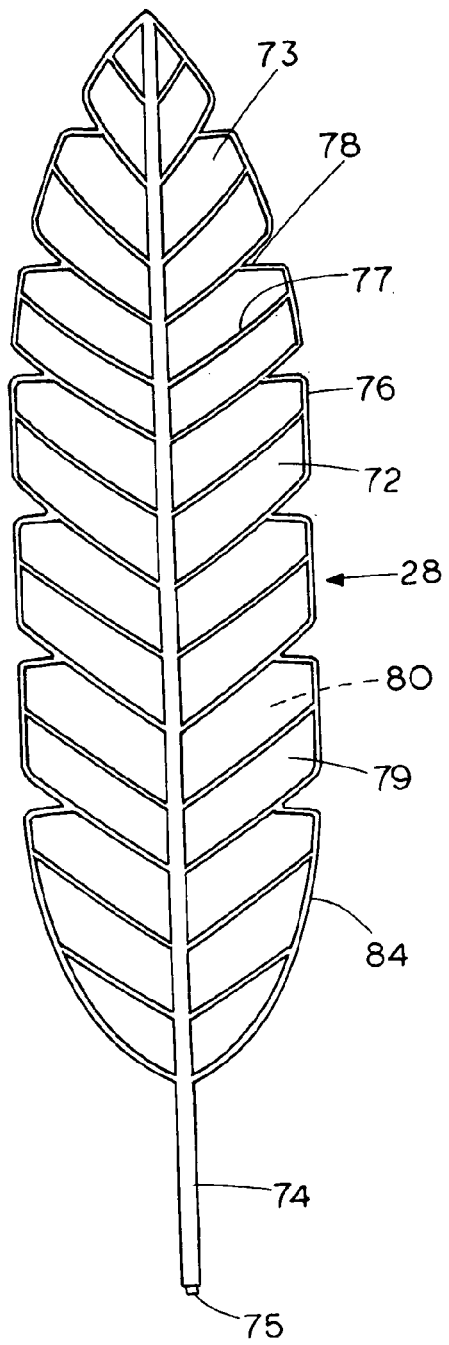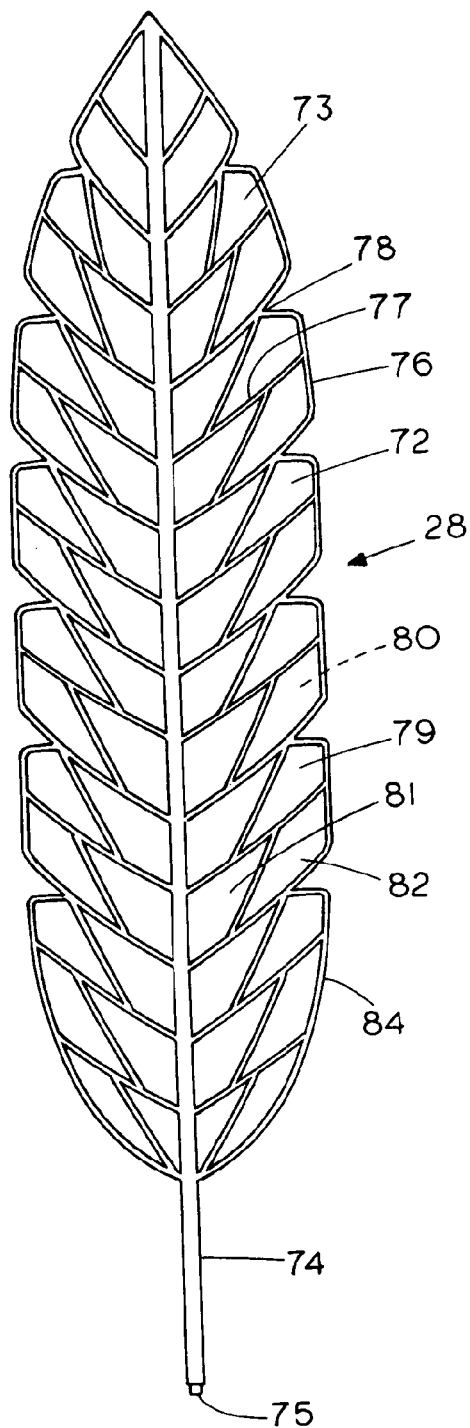

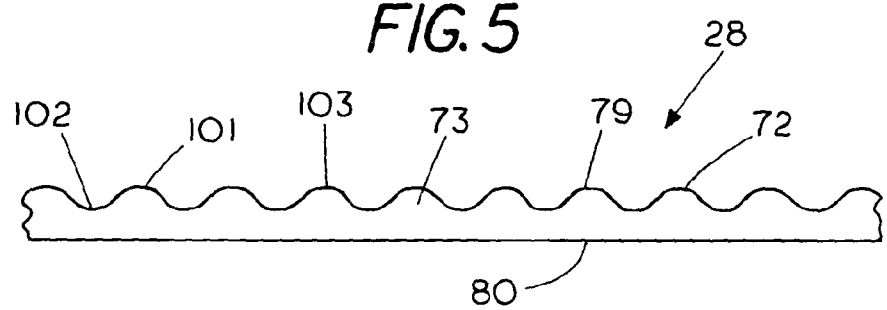
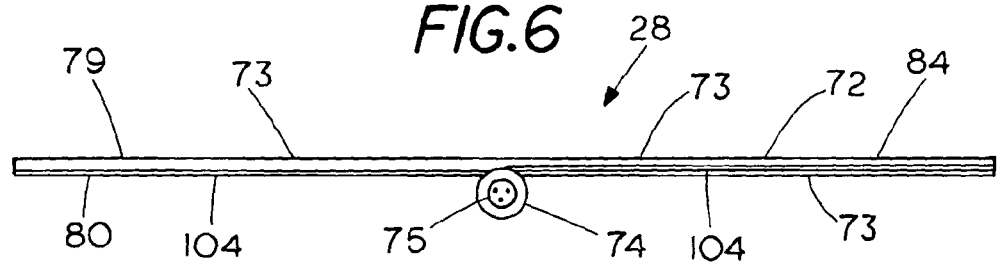
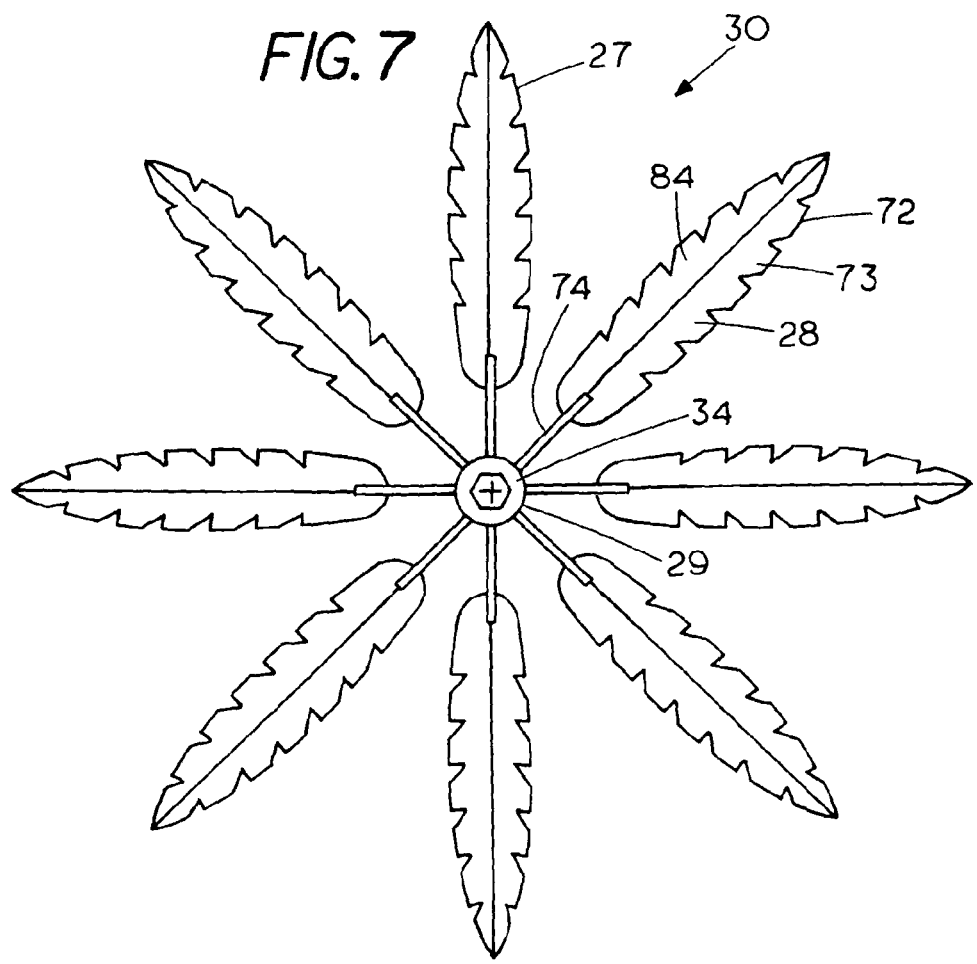

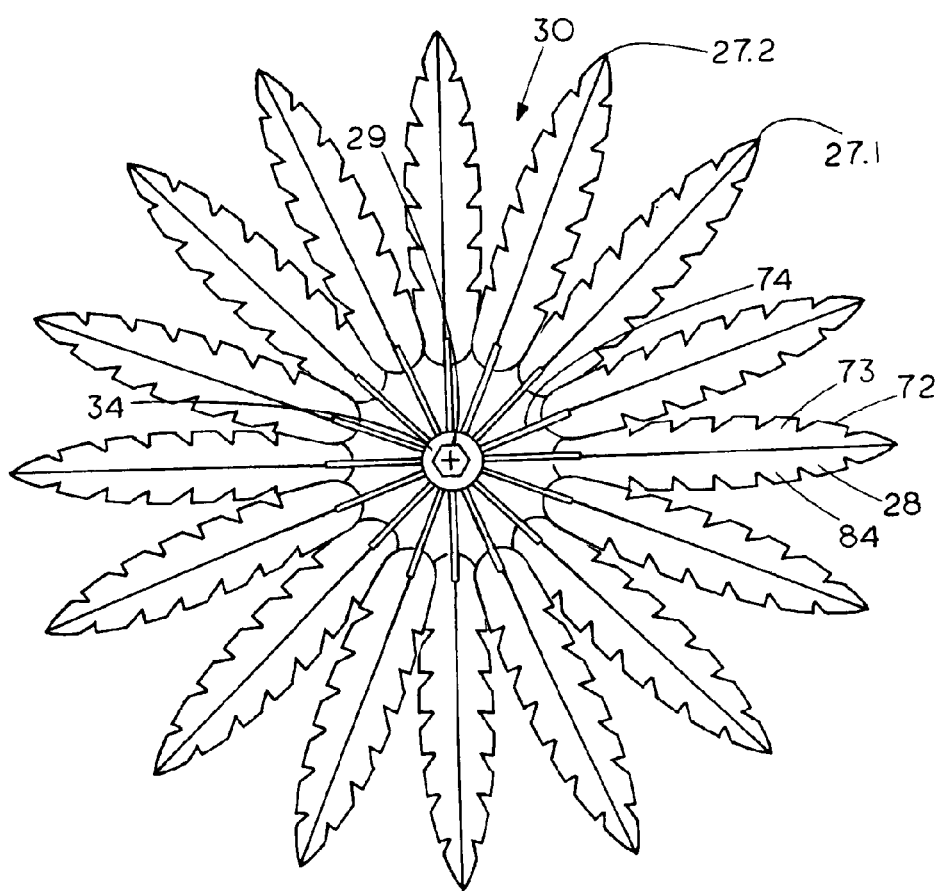

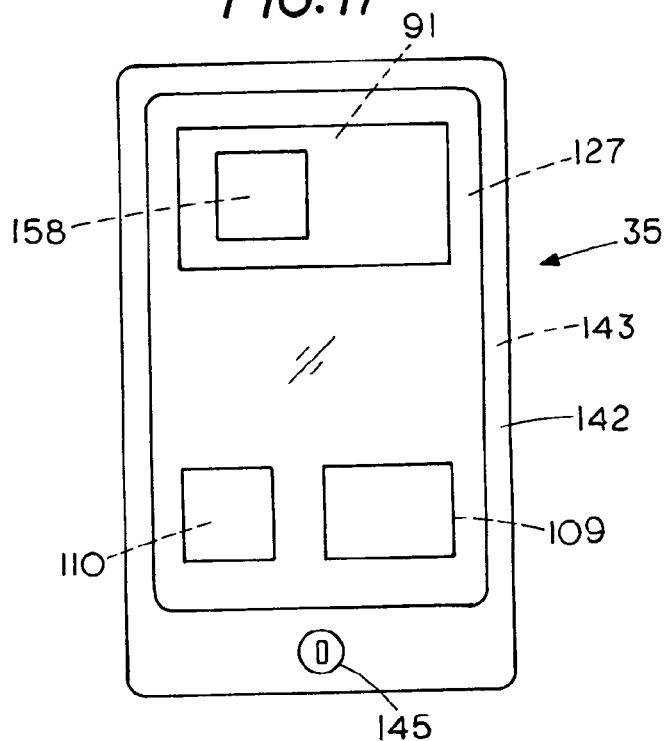
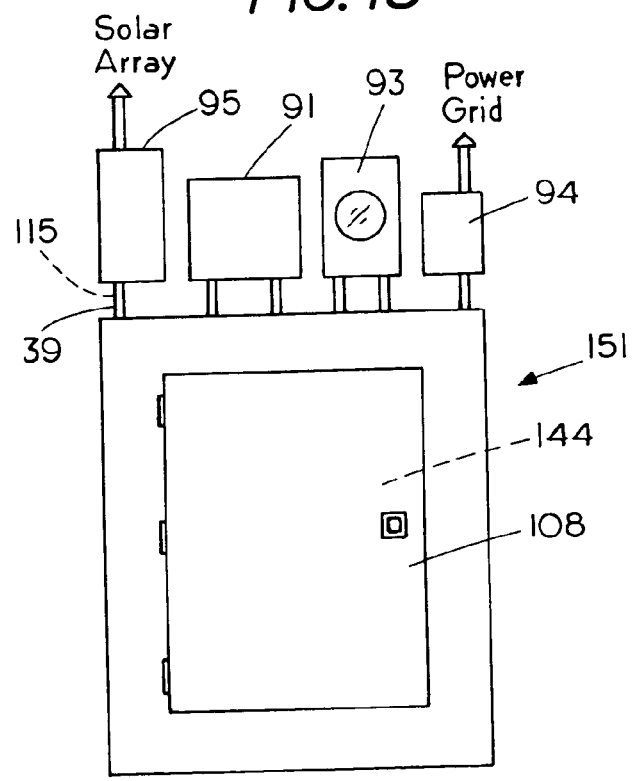

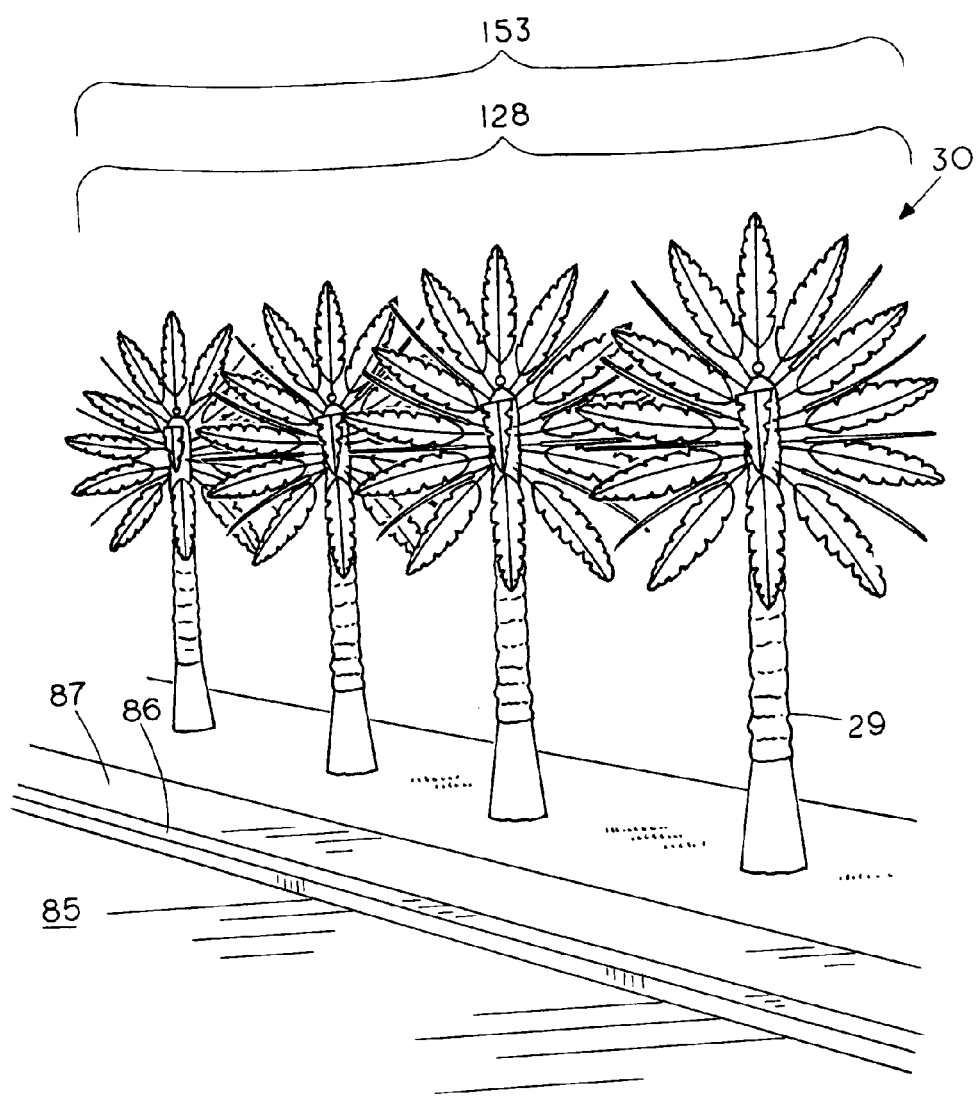

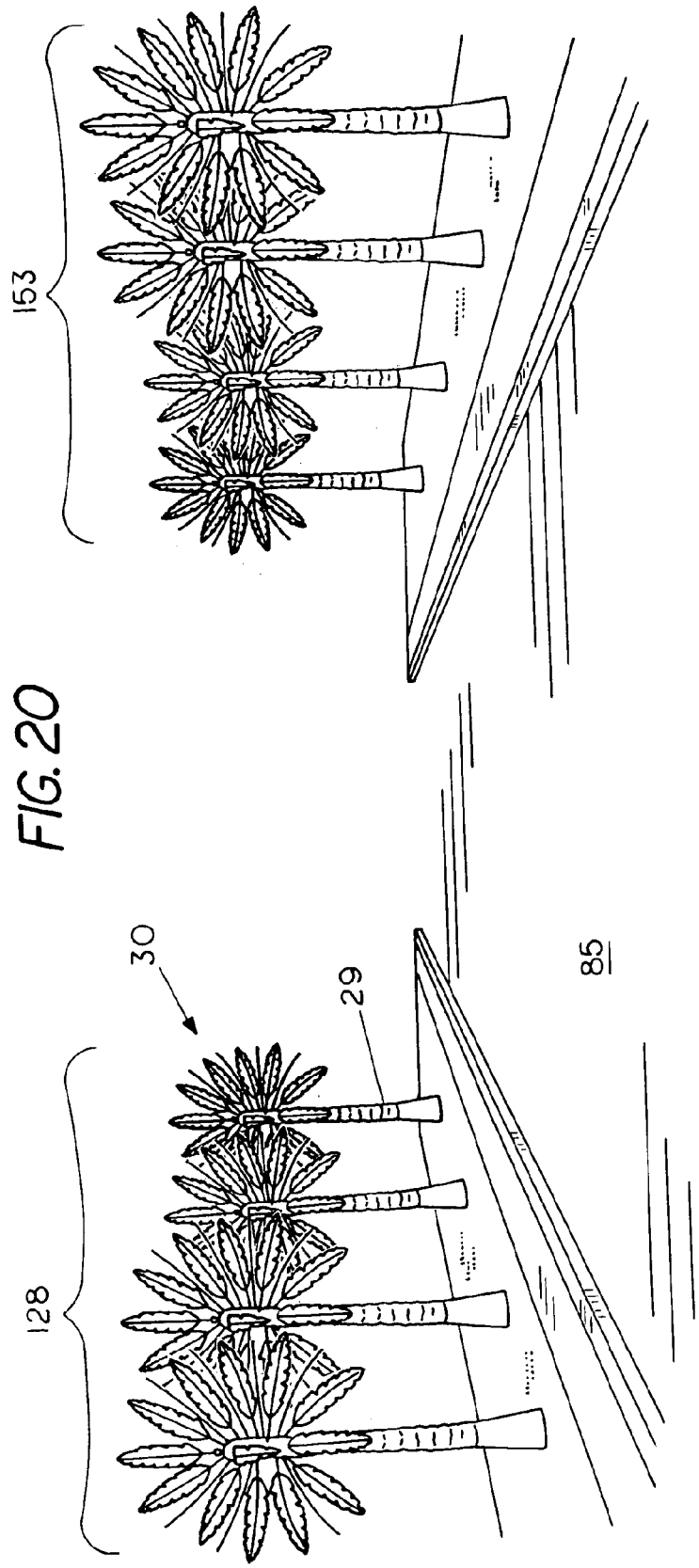

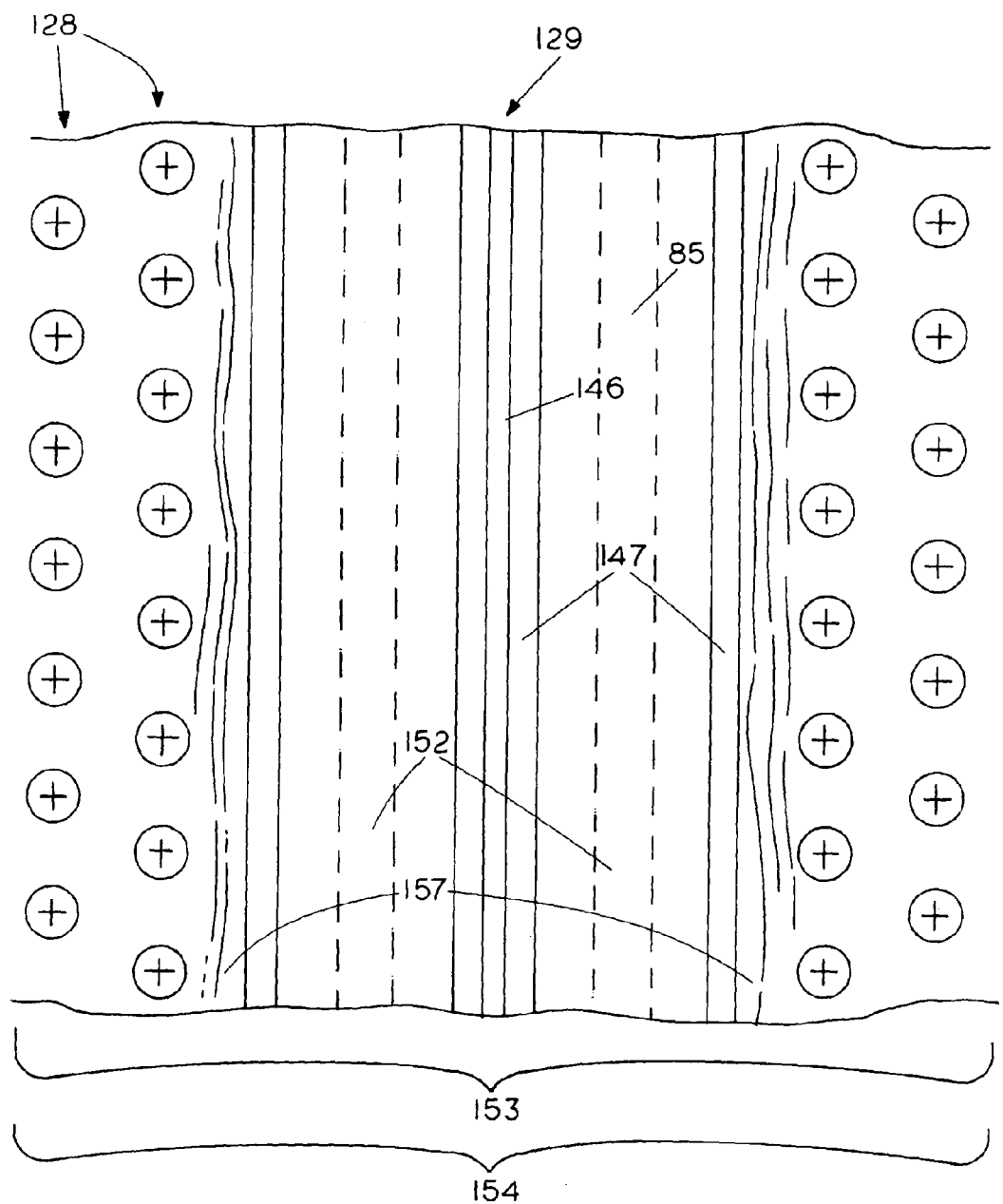

SOLAR CELL, MODULE, ARRAY, NETWORK, AND POWER GRID

FIELD OF THE INVENTION

The present invention relates to a solar cell, a solar module, a solar array, a network of solar arrays, and a solar power grid for generating electric power for industrial, residential, and transportation use.

BACKGROUND OF THE INVENTION

The world's present population is over six billion, and it is projected that by the year 2020 it will grow to over nine billion persons. Worldwide power consumption in 1997 was approximately 380 quadrillion British thermal units (Btu), and in response to the projected growth in population and industry the demand for power is expected to grow to about 608 quadrillion Btu by the year 2020. Likewise, worldwide consumption of oil is presently over 75 million barrels per day, and demand is expected to grow to about 120 million barrel per day by the year 2020. The world's oil reserves are estimated to be approximately 1,027 billion barrels. Fossil fuels such as coal, gas, and oil are non-renewable resources, and the burning of these fuels results in pollution of the earth's atmosphere, land, and water. Further, the burning of various fossil fuels contributes to global warming and dramatic changes in climate, thus mankind is presently faced with an environmental catastrophe. Various alternate means of producing power such as hydrogen cells are presently being developed for use. However, even the burning of a non-fossil fuel such as hydrogen can possibly contribute to the problem of global warming. The United States and other industrialized nations of the world are still largely dependent upon internal combustion engines for transportation which consume gasoline or diesel fuel. Accordingly, the demand for a renewable and environmentally friendly source of power is one of the foremost needs and problems facing mankind.

Moreover, the creation of power generating facilities have sometimes compromised aesthetics and had other adverse environmental impacts. Dams have sometimes restricted the navigation of waterways and adversely effected fish populations such as salmon in the Pacific Northwest region of the United States. Nuclear power stations have been associated with radiation leaks, pollution, and the production of hazardous radioactive waste, whereas coal, oil and gas burning power stations are associated with more conventional forms of pollution. The installation of poles and overhead transmission lines alongside roads can constitute a hazard for motorists and compromise aesthetics. Substantially all of the energy required for the creation and maintenance of life on the earth was originally provided by the sun. Solar energy is renewable and environmentally friendly. Faced with population, energy, and pollution crises, mankind can take a lesson from nature. The evolution of trees and other natural foliage on earth has been such as to maximize their ability to collect sunlight and perform photosynthesis. The present invention is directed towards providing renewable solar energy using solar arrays which resemble and emulate some of the light gathering abilities of natural foliage. In the words of Thomas Aquinas, "Grace does not abolish nature but perfects it."

SUMMARY OF THE INVENTION

The present invention teaches a solar cell, a solar module, a solar array, a network of solar arrays, and also a solar power grid suitable for providing power for industrial, residential and transportation use. A solar cell or solar module including a plurality of solar cells can comprise a structure configured to have the appearance of natural foliage. Accordingly, a solar array including a plurality of solar modules each including at least one solar cell can be made to resemble a palm tree, a deciduous tree, an evergreen tree, or other type of natural foliage. A network of solar arrays can be made to resemble a row or grove of palm trees, and thus meet the functional and aesthetic demands of landscape architecture. A network of solar arrays can extend for many miles alongside roads, highways, railways, pipelines, or canals. A network of solar arrays can comprise means for storing electric power. A network of solar arrays can comprise means for transmitting electric power. A network of solar arrays can comprise recharging stations for use by electric and hybrid transportation vehicles. A network of solar arrays can comprise at least a portion of a solar power grid.

The present invention teaches a solar cell comprising a structure configured to resemble natural foliage. The solar cell can comprise a structure configured to resemble a leaf. Alternatively, the solar cell can comprise a structure configured to resemble a branch including at least one leaf. Moreover, a solar cell can comprise a structure figured to resemble a leaf comprising a palm frond. A solar cell comprising a structure configured to resemble natural foliage can further include integral energy storage means such as a battery, or a capacitor. A solar cell comprising a structure configured to resemble natural foliage can further include one or more other electronic devices such as a transistor, diode, or chip.

The present invention teaches a solar module including a plurality of solar cells comprising a structure configured to resemble natural foliage. The solar module including a plurality of solar cells comprising a structure configured to resemble natural foliage can comprise a leaf. Further, the solar module including a plurality of solar cells comprising a structure configured to resemble natural foliage can comprise a branch including at least one leaf. The solar module including a plurality of solar cells comprising a structure configured to resemble natural foliage can comprise a leaf comprising a palm frond.

The present invention teaches a solar array comprising a structure configured to resemble natural foliage. The solar array can comprise a structure configured to resemble a plant such as a fern, a bush, grass, or other plant variety or species. In particular, a preferred solar array comprises a structure configured to resemble natural foliage comprising a tree, such as a palm tree, a deciduous tree, or an evergreen tree. The solar array comprising a structure configured to resemble natural foliage can comprise a plurality of solar modules each including at least one solar cell. The solar array comprising a structure configured to resemble natural foliage can further comprise electrical energy storage means such as a battery or capacitor. The solar array comprising a structure configured to resemble natural foliage can further comprise an inverter for changing DC current to AC current. The solar array comprising a structure configured to resemble natural foliage can further comprise means for transmitting electric power. The solar array comprising a structure configured to resemble natural foliage can further comprise means for recharging electric appliances. The solar array comprising a structure configured to resemble natural foliage can further comprise means for recharging a transportation vehicle.

The present invention teaches a network of solar arrays each including a plurality of solar modules comprising a structure configured to resemble natural foliage. A network of solar arrays each including a plurality of solar modules comprising a structure configured to resemble natural foliage can extend substantially alongside at least one road. Accordingly, a network of solar arrays each including a plurality of solar modules comprising a structure configured to resemble natural foliage can extend alongside a plurality of roads and highways. Alternatively, or in addition, the network of solar arrays each including a plurality of solar modules comprising a structure configured to resemble natural foliage can extend substantially alongside canals. Alternatively, or in addition, the network of solar arrays each including a plurality of solar modules comprising a structure configured to resemble natural foliage can extend substantially alongside a railway. Alternatively, or in addition, a network of solar arrays each including a plurality of solar modules comprising a structure configured to resemble natural foliage can comprise a portion of the landscape architecture about a building. For example, the network of solar arrays each including a plurality of solar modules comprising a structure configured to resemble natural foliage can comprise a portion of the landscape architecture about a residential home. A network of solar arrays each including a plurality of solar modules comprising a structure configured to resemble natural foliage can be in communication with at least one recharging station for transportation vehicles.

The present invention teaches a network of solar arrays each including a plurality of solar modules comprising a structure configured to resemble natural foliage which can comprise at least a portion of a solar power grid. The solar power grid can include means for storing electric power such as a battery or capacitor. The solar power grid can further include a transformer for changing the voltage of current. A transformer can comprise a step-up transformer for increasing the voltage of current, or alternatively can comprise a step-down transformer for decreasing the voltage of current. The solar power grid can further include an inverter for changing DC current to AC current, and also a converter for changing AC current to DC current. The solar power grid can further include means for transmitting electric power such as transmission lines. A network of solar arrays each including a plurality of solar modules comprising a structure configured to resemble natural foliage can comprise at least a portion of a solar power grid which can further include at least one recharging station for transportation vehicles.

Moreover, the present invention teaches a network of solar arrays extending substantially alongside at least one road, said network being in communication with at least one recharging station for providing electric power for transportation vehicles.

BRIEF DESCRIPTION OF THE DRAWINGS

FIG. 2 is a top plan view of an artificial palm frond that consists of a solar module including at least one solar cell for use with an artificial palm tree that consists of a solar array.

FIG. 3 is a top plan view an alternate artificial palm frond that consists of a solar module including a plurality of solar cells for use with an artificial palm tree that consists of a solar array.

FIG. 5 is a side cross-sectional view of an alternate solar module including a solar cell having a textured surface including a plurality of peaks and valleys.

FIG. 6 is a side cross-sectional view of an alternate solar module including a solar cell including an integral capacitor.

FIG. 7 is a top plan view of one layer of artificial palm fronds, each artificial palm frond consisting of a solar module including at least one solar cell for use with an artificial palm tree that consists of a solar array.

FIG. 8 is a top plan view of two staggered layers of artificial palm fronds, each artificial palm frond consisting of a solar module including at least one solar cell for use with an artificial palm tree that consists of a solar array.

FIG. 17 is a top perspective view of an alternate access door to the interior compartment of the bottom portion of the trunk of an artificial palm tree.

FIG. 18 is a side perspective view of a solar electric power control panel for possible residential use.

FIG. 19 is a perspective view of one side of a street and sidewalk including a row of artificial palm trees that consist of solar arrays.

FIG. 20 is a perspective view of two rows of artificial palm trees that consist of solar arrays positioned on opposite sides of a street.

FIG. 21 is a top plan view of a section of interstate highway showing a plurality of artificial palm trees that consist of solar arrays.

DETAILED DESCRIPTION OF THE INVENTION

Figure 1:
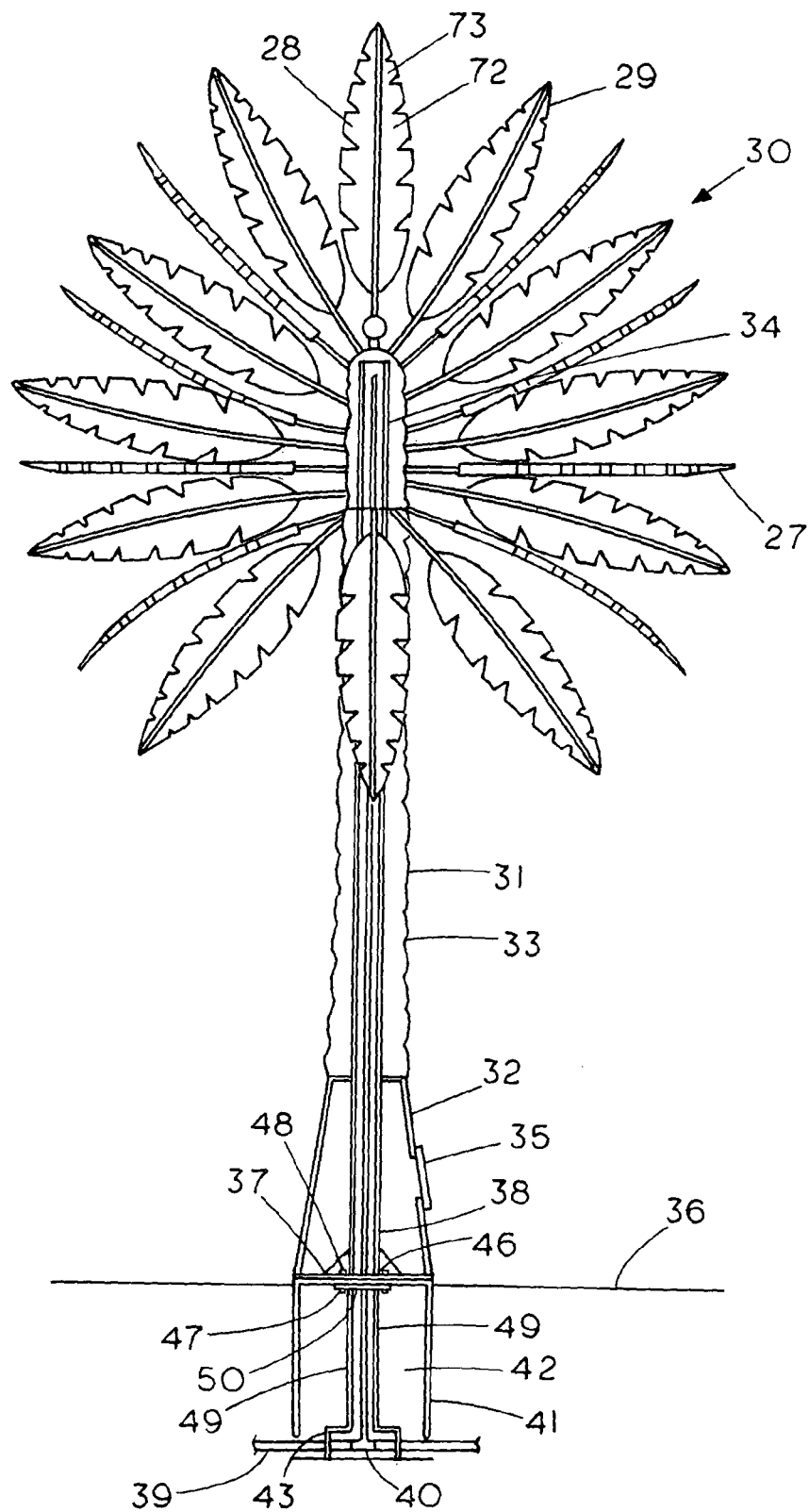
FIG. 1 is a perspective side view of an artificial palm tree that consists of a solar array.

The present invention teaches a solar cell, a solar module, a solar array, a network of solar arrays, and also a solar power grid suitable for providing power for industrial, residential and transportation use. A solar cell or solar module including a plurality of solar cells can be made in a structure configured to have the appearance of natural foliage. Accordingly, a solar array including a plurality of solar modules each including at least one solar cell can be made to resemble a palm tree, a deciduous tree, an evergreen tree, or other type of natural foliage. A network of solar arrays can be made to resemble a row or grove of palm trees, and thus meet the functional and aesthetic demands of landscape architecture. In the present application, the word road shall be understood to mean any path, road, street, or highway for transportation, and the word railway shall be understood to mean any mode or means of transportation guided by at least one rail. A network of solar arrays can extend for many miles alongside roads, highways, railways, pipelines, or canals, and can further include means for storing and transmitting electric power. A network of solar arrays can thereby provide power for residential, industrial, and transportation use. In particular, a network of solar arrays can be in communication with at least one recharging station for use by electric and hybrid transportation vehicles. Accordingly, a network of solar arrays can form at least a portion of a solar power grid.

Photovoltaic solar cells having a monocrystalline, polycrystalline, or amorphous structure, and an efficiency in the range between 1-35 percent have been in use for some time, and the associated cost of electricity using this technology has been in the range between 20-30 cents per kilowatt-hour, as compared with 9-10 cents for hydroelectric generated power. However, the efficiency of photovoltaic solar cells continues to improve, and their costs continue to decline such that they are expected to be as cost-effective as other forms of power within the next decade.

The following U.S. patents are directed to photovoltaic roofing or shading applications: U.S. Pat. No. 4,636,579, U.S. Pat. No. 5,385,848, U.S. Pat. No. 5,433,259, U.S. Pat. No. 5,478,407, U.S. Pat. No. 5,482,569, U.S. 2002/0129849, and U.S. 2002/0134422, all of these patents and patent applications hereby being incorporated by reference herein. Further, the following U.S. patents are directed to photovoltaic lights or signs: U.S. Pat. No. 4,200,904, U.S. Pat. No. 4,224,082, U.S. Pat. No. 4,281,369, U.S. Pat. No. 4,718,185, U.S. Pat. No. 4,841,416, U.S. Pat. No. 4,989,124, U.S. Pat. No. 5,149,188, U.S. Pat. No. 5,564,816, U.S. Pat. No. 6,060,658, U.S. Pat. No. 6,455,767, U.S. D353,014, all of these patents hereby being incorporated by reference herein.

Solar cells have often been made in panels which comprise a relatively rigid material such as crystalline silicon or crystalline gallium arsenide. However, photovoltaic solar cells can also be made in the form of flexible plastic thin film, such as Powerfilm® made by Iowa Thin Film Technologies, Inc., which holds both U.S. Pat. No. 6,300,158, and U.S. Pat. No. 5,385,848, these patents hereby being incorporated by reference herein. Solar cells have also been made in the form of textiles and fabrics, or alternatively, they can be affixed to textile and fabric materials as taught in U.S. Pat. No. 4,768,738, U.S. Pat. No. 5,478,407, U.S. Pat. No. 6,237,521, and U.S. Pat. No. 6,224,016, all of these patents hereby being incorporated by reference herein. The following U.S. patents and patent applications relate to solar cells, and in particular, many specifically relate to making thin film solar cells: U.S. Pat. No. 4,609,770, U.S. Pat. No. 4,670,293, U.S. Pat. No. 4,689,874, U.S. Pat. No. 5,584,940, U.S. Pat. No. 5,674,325, U.S. Pat. No. 5,863,354, U.S. Pat. No. 6,160,215, U.S. Pat. No. 6,168,968, U.S. Pat. No. 6,211,043, U.S. Pat. No. 6,224,016, U.S. Pat. No. 6,271,053, U.S. Pat. No. 6,294,722, U.S. Pat. No. 6,310,281, U.S. Pat. No. 6,327,994, U.S. Pat. No. 6,380,477, U.S. Pat. No. 6,437,231, U.S. Pat. No. 6,543,725, U.S. Pat. No. 6,552,405, U.S. 2001/0020485, U.S. 2002/0000242, U.S. 2002/0092558, U.S. 2002/0139411, and U.S. 2002/0153037, U.S. 2002/0182769, U.S. 2003/0029493, U.S. 2003/0041894, U.S. 2003/0113481, U.S. 2003/0127127, U.S. 2003/0127128, all of these patents and patent applications hereby being incorporated by reference herein. Some of the advances and reduction in the cost of photovoltaic solar cells is expected to derive from the ability to make extremely thin film solar cells.

Alternately, photovoltaic solar cells can also be made by painting or otherwise coating the surfaces of a desired substrate. Other electronic devices such as capacitors, resistors, transistors can also be made in this manner, and these can be included and used in combination with a solar cell. For example, see U.S. Pat. No. 6,099,637, U.S. Pat. No. 6,124,378, U.S. Pat. No. 6,480,366, U.S. Pat. No. 6,576,290, U.S. 2002/0157702, U.S. 2002/0158584, and U.S. 2003/0141417, by James E. Cordaro, and also U.S. Pat. No. 4,414,252 to Curtis M. Lampkin, all of these patents and patent applications hereby being incorporated by reference herein. Further, A. Paul Alivisatos, a professor of chemistry at University of California, Berkeley and others at Lawrence Berkeley National Laboratory are developing solar cells consisting of nanorods dispersed in an organic polymer or plastic which can be painted onto a surface. These researchers anticipate making solar cells which can absorb light having several different colors and wavelengths in order to better span the spectrum associated with sunlight. In addition, Neal R. Armstrong in the Department of Chemistry and others at the University of Arizona, are working to develop organic molecules that self-assemble or organize from liquid into efficient solar cell coatings, thus creating organic solar cell thin-films.

Conventional solar cells are commonly made in standard geometric shapes such as squares, rectangles, or circles. However, the present invention teaches making solar cells and solar modules including at least one solar cell having the appearance of leafs, palm fronds, branches, plants, trees and other natural foliage. Further, the present invention teaches making solar cells and solar modules in colors to resemble natural foliage. For example, plastic solar cell thin films and solar cells made by painting or other coating process can be pigmented to assume a desired color, and this can include the primary colors red, yellow, blue, and green, as well as a multiplicity of other colors, shades, and tones. Moreover, instead of the individual solar cells in a solar module being square, rectangular, or circular in appearance, the present invention teaches solar cells having a structure configured to resemble that of natural foliage, and in particular, the structures found in various types of leaves which commonly include a plurality of veins and isolated groups of cells. As a result, artificial leaves, palm fronds, branches, plants, and trees, as well as other artificial foliage can be created which closely resemble their natural counterparts. Besides providing clean and renewable solar generated electric power, the artificial foliage can provide shade, serve as windbreak, and meet both the functional and aesthetic demands of landscape architecture.

Palm trees line the streets of Beverly Hills, Calif., but also Las Palmas Drive in Hope Ranch, and also along the beach in Santa Barbara, Calif., a location that is sometimes called the American Riviera. Similarly, palm trees line the street and beach area in the city of Bandol, France and much of the French Riviera. Further, the presence of palm trees has long been associated with the presence of an oasis, water, life, and wealth in the Middle East. Accordingly, palm trees line most of the major streets and highways in the United Arab Emirates. In contrast with conventional power and telephone poles associated with overhead transmission lines, a palm tree, even an artificial palm tree, has an appearance which is aesthetically pleasing and associated with an upscale community. Artificial palm trees having a realistic appearance and a height between 8-28 feet are presently made and distributed by Earthflora.com of Cleveland, Ohio. Antenna towers which are disguised to have the appearance as trees are taught in U.S. Pat. No. 5,611,176, U.S. Pat. No. 5,787,649, U.S. Pat. No. 6,343,440, and U.S. 2002/0184833, all of these patents and the patent application hereby being incorporated by reference herein.

A multitude of different palm tree species exist having different characteristics. Common varieties of palm trees include date palms, banana palms, coconut palms, queen palms, and royal palms. Palm trees having upwards of six and even thirty or more leaves or palm fronds are common. Trees are one of nature's solar collectors. The palm tree often includes a multiplicity of palm fronds projecting at a plurality of different angles and orientations relative to the truck of the palm tree in order to maximize its ability to capture light. The resulting exposed surface area can be substantial, and in this regard nature has provided an efficient model for capturing sunlight from sunrise to sunset. Further, when the ground surface surrounding a tree such as a palm tree consists of light colored sand or other surface that reflects substantial light, the tree's leaves or palm fronds can capture reflected light as well as direct sunlight. Accordingly, light can sometimes be captured by the bottom side of the leaves or palm fronts as well as the top side. This greatly increases the exposed surface area and enhances the ability of the foliage to capture light.

In an embodiment of the present invention, an artificial palm tree consisting of a solar array can be created by using between six and forty artificial palm fronds, although a greater or lesser number of artificial palm fronds can be used, as desired. For the purpose of providing an example concerning the performance of such a solar array, a model can be constructed using photovoltaic thin film made by Iowa Thin Film Technology, Inc. A total of thirty-two artificial palm fronds can be arranged in four staggered layers with each layer including eight artificial palm fronds. The artificial palm fronds can have a stem approximately one and one half feet long. The working surface of the blade portion of each of the artificial palm fronds can measure approximately one foot by six feet, thus providing an area of six square feet. Accordingly, the total working surface area of the artificial palm tree model can consist of 192 square feet.

The resulting solar array can produce significant amounts of electrical power. In particular, each artificial palm frond including a R15-1200 Powerfilm® module made by Iowa Thin Film Technology, Inc. operates at 15.4 volts and produces 1.2 amps. Multiplying the volts times the amps yields 18.48 watt-hours of power, and then multiplying the rounded off 18 watt-hours by eight hours of sunlight yields 144 watt-hours per day for each artificial palm frond. Further, multiplying 144 watt-hours by thirty two fronds yields 4.6 kilowatt-hours per day for a single artificial palm tree consisting of a solar array. If and when there would be more than eight hours of sunlight, or when the artificial palm fronds would be larger in size, or when an additional thirty two R15-1200 Powerfilm® modules would be affixed to the bottom side of the artificial palm fronds as well, then the amount of power generated in a single day would be increased over and above the 4.6 kilowatt-hours per day.

A large portion of the Southwest region of the United States averages between six and seven hours of peak solar exposure or so-called "full sun hours" during the day, and the peak solar exposure in desert regions located closer to the equator is even greater. The sun's power or irradiance peaks at about 1,000 watts per square meter per hour. Most commercially available crystalline silicon photovoltaic solar cells have an efficiency of about 14-16 percent, but at least one major manufacture has a solar cell in development which can exceed 35 percent efficiency. Typical amorphous solar cells such as those commonly associated with flexible thin-films presently have an efficiency of approximately 5-6 percent, but thin-film solar cells are also in development which have greater efficiency. It would be possible to enjoy sunny days at least 75 percent of the time when the solar array would be located in Southern California, Arizona, or Nevada, thus providing about 294 days of productive power generation each year. In this regard, a solar reference cell such as one made or distributed by Kyocera Solar, Inc. of Scottsdale, Ariz. can be used to measure the solar energy present in a given location. A solar array which can produce 4.6 kilowatt-hours given eight hours of exposure each day can generate approximately 1,352 kilowatt-hours each year, that is, given 294 productive days and a total of 2,262 productive hours. However, in desert climates such as the United Arab Emirates there could well be 360 productive days each year, thus 1,656 kilowatt-hours could be produced over 2,880 productive hours.

The artificial palm tree model consisting of a solar array can include a trunk approximately twenty feet high and have an overall height of about twenty-four feet. Further, each solar array can have a diameter of approximately sixteen feet, that is, given the span of two opposing artificial palm fronds each including stems one and one half feet long, blades six feet long, and a pole or trunk having a diameter of one foot. Given these dimensions, it can be advantageous that the artificial palm trees be separated by approximately thirty two feet on center in order to provide approximately sixteen feet of space between the ends of the artificial palm fronds in closest proximity, as this will avoid counterproductive shading out of adjacent artificial palm trees and solar arrays when the sun is inclined at less than 45 degrees with respect to the underlying ground surface. Accordingly, a single row of artificial palm trees and solar arrays spaced thirty two feet apart on both sides of a road can total approximately 330 units over a linear mile, and when a staggered double row is used on both sides of a highway the total can be approximately 660 units. Multiplying 1,352 kilowatt-hours per individual artificial palm tree and solar array per year given 294 productive days by 660 units along each mile of highway yields 892,320 kilowatt-hours per year. The average U.S. home consumes approximately 8,900 kilowatt-hours each year, thus each mile of highway so equipped could satisfy the power requirements of approximately 100 homes.

In the worst case scenario, given present distributor pricing for R15-1200 Powerfilm® photovoltaic thin film, the cost of each installed model artificial palm tree solar array would be approximately $13,000. dollars. The cost of 660 solar arrays along a one mile stretch of highway would then be approximately $8,580,000. dollars. Assuming that the solar arrays would have a twenty year working life, then the annual cost for providing power to approximately 100 homes would be $429,000. dollars, or $4,290. dollars for each home. In the Pacific Northwest region of the United States, the cost of electricity is approximately 10 cents per kilowatt-hour, thus the annual cost of electricity for a home that consumes 8,900 kilowatt-hours is only $890. dollars. The relative cost of the photovoltaic solar energy system would then be approximately 4.8 times greater than that of the existing system in the Pacific Northwest. However, if the solar arrays would enjoy a forty year working life the annual cost for providing power to approximately 100 homes would be $214,500. dollars, or $2,145. dollars for each home. The relative cost of the photovoltaic solar energy system would then be approximately 2.4 times greater than that of the existing system in the Pacific Northwest.

However, the present distributor pricing for R15-1200 Powerfilm® photovoltaic thin film is based upon a scale of production associated with the manufacture of only several thousand feet of material. If each artificial palm tree and solar array would use thirty two artificial palm fronds including a one foot by six foot long photovoltaic thin-film solar module, then 192 linear feet of such material would be required just to cover the top sides of the artificial palm fronds. The creation of 660 solar arrays over a mile of highway would require some 126,720 linear feet or approximately 24 miles of material. Accordingly, 100 miles of highway would require 2,400 miles of such material, and 1,000 miles of highway would require 24,000 miles of such material, that is, nearly equal to the circumference of the earth. Accordingly, the cost of producing photovoltaic thin film would decrease dramatically when manufactured on this scale. If the cost of the photovoltaic material used to make the solar modules can be cut in half when manufactured on this scale, and the solar arrays have a working life of forty years, then the cost of producing solar energy by this means equals the 9-10 cents per kilowatt-hour presently being paid by homeowners in the Pacific Northwest.

Once installed, the solar arrays can be easily maintained without substantial further expense. The artificial palm frond and solar module portion of the solar arrays can be recycled and renewed at the end of their expected twenty to forty year service life. If and when newer and more highly efficient artificial palm fronds and solar modules become available, then the older and less efficient components can be easily replaced without requiring significant changes to the network of solar arrays and solar power grid.

It is also important to recognize that the above calculations are unrealistically biased in favor of the status quo, as they are based on the assumption that the present cost of residential electric power in the Pacific Northwest will remain fixed at the present price of 9-10 cents per kilowatt-hour over the next forty years. Given the ever-increasing demand for energy this will certainly not be the case. Further, the Pacific Northwest is fortunate to enjoy hydroelectric power, whereas most of the United States and the rest of the world is dependent upon the burning of fossil fuels such as coal, oil, and gas in order to generate electric power. The cost of burning fossil fuels to produce energy is expected to increase dramatically over the next twenty to forty year time horizon. In fact, some experts believe that the world's non-renewable fossil fuel reserves will be largely exhausted during this period. In contrast, the cost of making and producing photovoltaic solar cells is expected to decrease dramatically.

Moreover, it should also be recognized that the investment costs associated with creating a network of solar cell arrays and solar power grid today will be partially offset by the effects of inflation over the next twenty to forty year period, as was the case with the dams and hydroelectric power plants built during the administration of President Franklin Roosevelt. Inflation is difficult to predict with great certainty, but since 1980 the value of the dollar has decreased such that it now enjoys slightly less than 50 percent of its former purchasing power. In particular, it would have taken $2.18 in 2002 to match the purchasing power of one dollar in 1980. Accordingly, in the years 2020 and 2040 the investment made today in photovoltaic solar energy will appear as cost effective and prudent as the hydroelectric power initiatives of the 1930's and 1940's.

It can also be maintained that the net social welfare benefit associated with the use of clean and renewable solar power, as opposed to non-renewable fossil fuels such as petroleum, natural gas, or coal, also includes the cost savings and investment associated with the latter resources not being consumed. A barrel of oil saved is in some sense a barrel of oil earned, that is, it is a form of accumulated wealth. For example, when renewable solar energy is used the world has essentially saved the equivalent amount of energy associated with burning fossil fuels and saved it for higher value added use in the future. When viewed from a time horizon of a hundred or thousand years, fossil fuels such as petroleum are worth far more in the ground, than they are today when simply burned-up as fuel.

It is possible to roughly estimate the net social welfare benefit associated with using clean and renewable solar power as opposed to non-renewable fossil fuels such as petroleum, natural gas, or coal. The present cost of a barrel containing 42 gallons of crude oil is approximately $30.00 dollars, but this represents only about 42 percent of the cost of a petroleum end product as delivered to a consumer, thus the actual cost to a household would be approximately $71.42 dollars. One barrel of crude oil is equal to 5,800,000 Btu, and one gallon of gasoline is equal to 124,000 Btu, whereas one gallon of diesel fuel is equal to 139,000 Btu. One kilowatt-hour of electricity is equal to 3,412 Btu. Accordingly, one barrel of crude oil is equal to approximately 1,670 kilowatt-hours. The annual energy consumption associated with electric power and heating for the average home in the United States is approximately 8,900 kilowatt-hours. However, the energy consumption of the average middle class home in the United States is greater. The inventor presently owns a 2,450 square foot home in a suburb of Portland, Oreg. Last year about $567. dollars was paid for electric power, and about $815. dollars was paid for natural gas for a total of approximately $1,381. dollars. Converting that sum into kilowatt-hours given a present cost of 10 cents per kilowatt-hour yields a total annual consumption of 13,810 kilowatt-hours.

Furthermore, the annual fuel consumption and energy cost associated with the use of an automobile in the United States should also be considered. An automobile that uses gasoline having a fuel efficiency of 20 miles to the gallon which is driven 12,000 miles each year will consume approximately 600 gallons of gasoline. Given a gasoline fuel cost of $1.75 per gallon, those 600 gallons will cost $1,050. dollars, and they would fill about 14.25 barrels having a capacity of 42 gallons. Almost everything contained in a barrel of crude oil is refined and used to make various petroleum products, but most refineries only produce about 19 gallons of gasoline from a 42 gallon barrel of crude oil. Accordingly, about 1,326 gallons of crude oil are refined to produce those 600 gallons of gasoline, and such would fill about 31.6 barrels having a capacity of 42 gallons. One gallon of gasoline is equal to 124,000 Btu, and thus 600 gallons of gasoline equals 74,400,000 Btu. One kilowatt-hour of electricity is equal to 3,412 Btu. Accordingly, those 600 gallons of gasoline equate to about 21,805 kilowatt-hours, thus over twice what the average home in the United States consumes for basic electric power and heating. Moreover, the burning of fossil fuels also results in additional direct and indirect costs associated with pollution and global warming. While substantial, these indirect costs are difficult to estimate.

It is clear that United States needs to switch from automobiles which burn gasoline and diesel fuel to electric vehicles as soon as possible. In this regard, it should be recognized that merely switching from automobiles that burn gasoline and diesel fuel to electric cars which must be charged by electric power plants which burn fossil fuels would not provide a viable long term solution to the world's energy and pollution problems. At this time, and for the foreseeable future, the only clean and renewable form of electric power comes from the sun. That power needs to be made available where automobiles are most often used, thus along the sides of our nation's roads and highways. Accordingly, the creation of a network of solar arrays and a solar grid along roads and highways can not only provide electric power for residential and commercial use, but also support and make viable the use of electric vehicles.

FIG. 1 is a side perspective view of an artificial palm tree 29 that constitutes a solar array 30. The artificial palm tree 29 and solar array 30 can include a trunk 31 having a trunk bottom portion 32, a trunk middle portion 33, and trunk top portion 34. The truck bottom portion 32 can include an access door 35. The artificial palm tree 29 and solar array 30 can include a central support pole 38 including a base 37 having a reinforced base flange 46. The base flange 46 can bear against a footing 126 including support platform 49 having a reinforced platform flange 50. The support platform 49 can include a bottom portion including a stand-off 43 for permitting concrete to substantially encompass the support platform 49. The concrete can be contained when poured by a circular shaped tube or form 41. The top side of the platform flange 50 of the support platform 49 can then be made approximately level with the surrounding ground surface 36. The base flange 46 can be secured to the platform flange 50 using bolts 47, nuts 48, and washers 51 which can also be used to properly align the central support pole 38 vertically. The artificial palm tree 29 and solar array 30 can include a plurality of artificial palm fronds 72 that include at least one solar panel or solar module 28 including at least one solar cell 73. The artificial palm tree 29 and solar array 30 can include at least one layer 27 of artificial palm fronds 72, and each layer can include a plurality of artificial palm fronds 72 and solar modules 28. Alternatively, the structure and placement of the artificial palm fronds 72 and solar modules 28 can be configured to appear more random.

Figure 4:
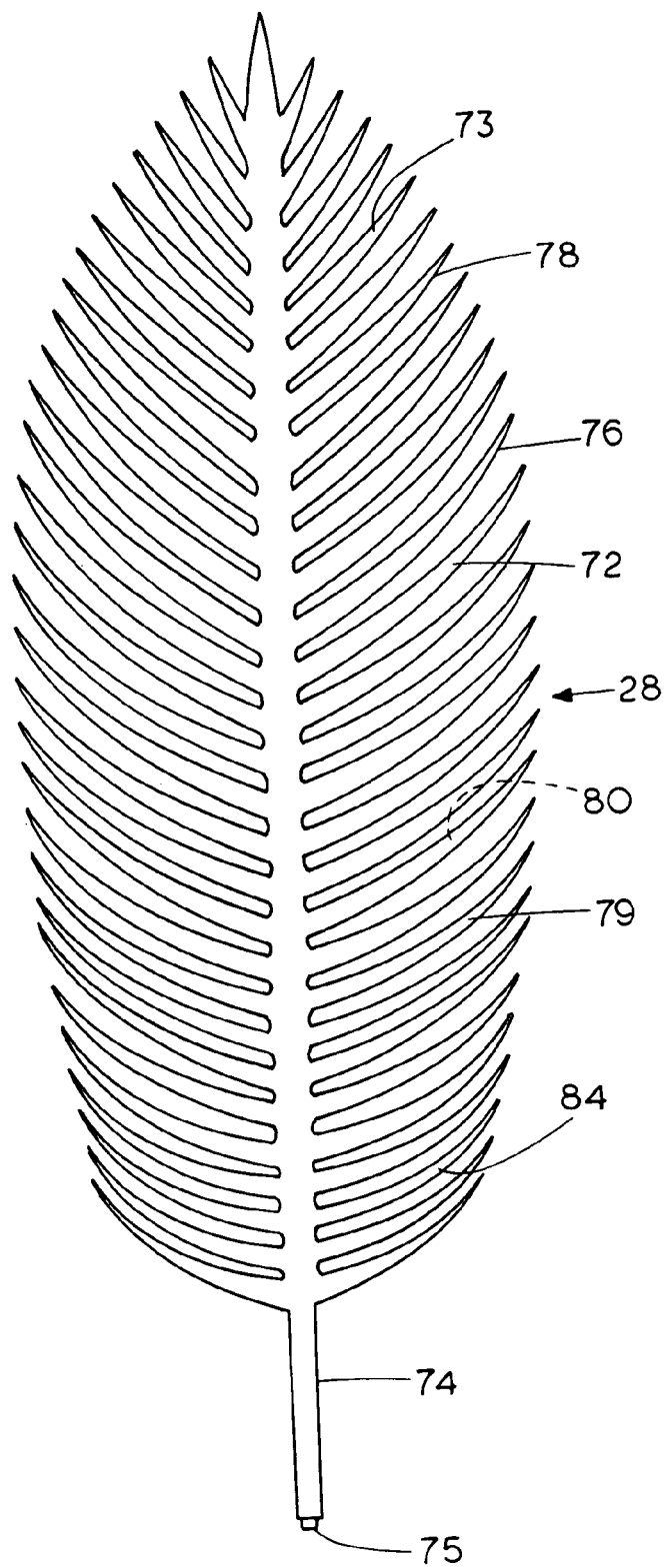
FIG. 4 is a top plan view an alternate artificial palm frond including a plurality of blades that consists of a solar module including a plurality of solar cells for use with an artificial palm tree that consists of a solar array.

FIG. 2 is a top plan view of an artificial leaf or palm frond 72 that includes at least one solar panel or solar module 28 for use with an artificial palm tree 29 that constitutes a solar array 30. Over two hundred varieties of palms exist in nature, and this particular embodiment generally resembles a banana leaf or palm frond. The artificial palm frond 72 includes a stem portion 74, a blade portion 84, at least one electrical connection or socket 75, a top side 79, a bottom side 80, an edge 76, a plurality of notches 78, and can also include a plurality of artificial veins 77. The color of the solar cells 73 can be a medium or dark green, and that of the veins 77 and edge can be a lighter green, yellow, or brown. Further the color of the individual solar cells 73, and also both the top side 79 and bottom side 80 of the artificial palm frond 72 can be varied in different locations so as to create a natural appearance. The structure and color of the artificial palm frond 72 can also be selected to maximize light absorption from different angles of incidence, and if desired, the structure and color can also be selected for its ability to coincidentally reflect light which can then be absorbed by other nearby artificial palm fronds 72. As shown in FIG. 2, the solar module 28 can include at least one solar cell 73. Depending upon their particular structure and electrical properties, the solar cells 73 can be wired in series, or alternately they can be wired in parallel with other solar cells 73. Likewise, depending upon their structure and electrical properties, the solar panels or modules 28 can also be wired in series or parallel. The bottom side 80 of the artificial palm frond 72 can consist of plastic material such as polyethylene, polypropylene, polyurethane, a metal material such as aluminum, copper, stainless steel, or a ceramic material. Flexible plastic or polyurethane materials can be advantageous for use, and in particular, when an artificial palm frond 72 is configured to resemble one for a coconut palm or a date palm tree. As shown in FIG. 4, the palm fronds associated with these palm trees include a plurality of highly flexible separate blades. Artificial palm fronds 72 and leaves which are flexible can be advantageous when attempting to simulate a natural appearance. Moreover, artificial leaves, palm fronds, and branches which are flexible also enhance the ability of these structures to be self-cleaning, as wind, morning dew, and rain can then better wash their surfaces clean. As shown in FIG. 2, the stem 74 portion of the artificial palm frond 72 measures approximately one and one half feet in length and is approximately one inch in diameter. The blade 84 portion is approximately eight feet long and two feet wide, and has a working surface area of approximately twelve square feet. Accordingly, an artificial palm tree 29 or solar array 30 including thirty two such artificial palm fronds 72 has a working surface area of 384 square feet, and so could provide double the power output of the model solar array discussed earlier that used a plurality of solar modules 28 consisting of Powerfilm R15-1200 Powerfilm® photovoltaic thin film having a working surface of only 192 square feet. And an artificial palm tree 29 or solar array 30 including thirty six such artificial palm fronds 72 and solar modules 28 would have a working surface area of 432 square feet, and provide even more power. Accordingly, a network including 660 such solar arrays along a one mile stretch of highway could meet the needs of approximately 200 average homes.

FIG. 3 is a top plan view of an artificial palm frond 72 generally similar to that shown in FIG. 2. However, the artificial palm frond 72 shown in FIG. 2 further includes a middle portion 81 and also peripheral portion 82, each of these portions including a plurality of separate solar cells 73. The color as well as other physical and electrical properties of the middle portion 81 and peripheral portion 82 of the artificial palm frond 72 can be selectively varied, as desired, in order to enhance its efficiency and natural appearance. Depending upon the structure and electrical characteristics of the solar cells 73 being used, the use of more numerous solar cells 73, and the location of solar cells 73 in both the middle portion 81 and also the peripheral portion 82 can increase the efficiency of the solar module 28 when partial shading of the artificial palm frond 72 would occur.

FIG. 4 is a top plan view of an artificial palm frond 72 generally similar to that shown in FIGS. 2 and 3. However, this particular embodiment includes a plurality of separate and relatively thin blades 84. Accordingly, this embodiment of an artificial palm frond 72 has a structure configured to resemble the palm fronds associated with coconut palms and date palms.

FIG. 5 is an enlarged side view of an alternate solar module 28 including at least one solar cell 73 having a textured surface 103 including a plurality of peaks 101 and valleys 102. A textured surface 103 which is not perfectly planar and smooth can increase the effective working area of a solar module 28 and solar cell 73. Accordingly, the use of a textured surface 103 can sometimes enhance the light absorption properties, but also the light reflecting properties of a solar module 28 and solar cell 73. Many plant species have leaves or exterior surfaces that are not perfectly smooth, rather they commonly include textured surfaces, convolutions, or other irregularities. For example, many forms of seaweed have textured, ribbed or convoluted surfaces including numerous peaks and valleys, and this can provide greater surface area both for collecting light, but also for absorbing nutrients from the sea. Photovoltaic solar cells including textured surfaces are known in the prior art, such as U.S. Pat. No. 6,552,405 granted to Sugawara et al. and assigned to Kyocera Corporation, this patent hereby being incorporated by reference herein.

FIG. 6 is a side cross-sectional view of an alternate solar module 28 including an integral capacitor 104. The capacitor 104 can consist of a relatively thin layer which can be formed or deposited by conventional means including but not limited to painting, coating, vapor and also powder deposition upon one of the substrates used to make the solar module 72. U.S. Pat. No. 6,480,366 and U.S. Patent Application 2002/0158584 by James F. Cordaro teach painted capacitor energy storage, these two patent documents hereby being incorporated by reference herein. As shown on the left side in FIG. 6, an integral capacitor 104 can be positioned on the bottom side 80 of an artificial leaf or palm frond 72, thus the top side 79 can be used exclusively for absorbing light. Alternatively, as shown on the right side in FIG. 6, an integral capacitor 104 can be positioned between the top side 79 and bottom side 80 of an artificial leaf or palm frond 72, thus both the top side 79 and bottom side 80 can be used to absorb light. An artificial leaf or palm frond 72 including a solar module 28 including at least one solar cell 73 can be made in the general configuration shown on the left side of FIG. 6, or alternatively, in the general configuration shown on the right side of FIG. 6. As shown, it is also possible to combine the two structures illustrated in FIG. 6 when making a single solar module 72. Moreover, a plurality of solar modules 28 including capacitors 104 can be selectively positioned in functional relation to a solar array 30 to maximize both energy production and energy storage.

FIG. 7 is a top plan view of a layer 27 including a plurality of artificial palm fronds 72. The artificial palm fronds 72 each include a solar module 28 including at least one solar cell 73, and can be used to create an artificial palm tree 29 that forms solar array 30. As shown, the layer 27 includes eight artificial palm fronds 72 each having a stem 74 approximately one and one half foot long. The blade 84 has a maximum width of approximately two feet, a length of approximately eight feet, and a working surface area of approximately twelve square feet. Other dimensions for the stem and blade portions can be used. However, given the configuration and dimensions shown in FIG. 7, a maximum blade 84 width of approximately three feet is all that can be attempted without causing portions of adjacent artificial palm fronds 72 to overlap one another. When less than eight artificial palm fronds 72 are used, then the width dimension of the blades 84 can be more easily increased. Generally, it is most advantageous to use between five and ten artificial palm fronds 72 in a single layer 27. As shown in FIG. 7, the artificial palm fronds 72 including solar modules 28 can be removably secured to the top portion 34 of the trunk 21 of an artificial palm tree 29.

FIG. 8 is a top plan view of two partially overlapping and staggered layers 27 of artificial palm fronds 72, each including a solar module 28 including at least one a solar cell 73 for use with an artificial palm tree 29 that consists of a solar array 30. In particular, shown is a first layer 27.1, and also a second layer 27.2 which is in a superior position relative to the first layer 27.1. Some photovoltaic solar panels or modules that are made with a plurality of solar cells which are wired in series can suffer a substantial degradation in their power output when even a single solar cell is shaded. And some of these solar panels or modules cannot be wired in parallel in order to simply correct for this problem, as those solar cells which are being shaded can still unduly influence the overall power output of the solar panel or solar module. However, it is possible to introduce transistors, diodes, sensors, chips, and controllers for monitoring the activity of individual solar cells, or groups of solar cells which are present in a solar module, as well as the activity between different solar modules, and then appropriately turn off, isolate, or otherwise control the current either flowing from or being drawn towards a given solar cell or solar module. In this way, any undesired effects which might be caused by shading, or by a solar cell possibly becoming damaged or rendered inoperable can be avoided. Accordingly, the operational efficiency of the solar module and solar array can be optimized. One of the advantages of flexible thin film solar cells and also those which can be made by painting or other coating processes is that they can be less prone to suffering a dramatic reduction in their power output given low light conditions, shading, or damage to individual solar cells. In many cases, when a portion of the solar cell is being shaded, then the power output of that particular area is effected, but there is then little or no collateral effect upon other solar cells in a given solar module.

It can be advantageous to design a solar array in order to maximize its power output during operation. At some point, the introduction of a greater number of artificial palm fronds, or a larger size artificial palm frond, or additional layers of artificial palm fronds can introduce more substantial shading and this can provide diminishing returns with regards to the efficiency of the solar array. It can also be advantageous to consider and factor in the relative height, path, intensity, and position of the sun at various times of the year when designing and installing a solar array. In some cases, a single layer including between five and ten artificial palm fronds can provide optimal efficiency, and the appearance of these solar arrays can then more closely resemble certain palm species such as coconut palms. In other cases, a plurality of layers including solar modules consisting of artificial palm fronds each including a plurality of relatively thin blades can be more suitable, and in particular, when attempting to imitate the appearance of date palms.

Another consideration is whether to provide solar cells on only the top side, or on both the top side and bottom side of some or all of the artificial palm fronds. Given the presence of light colored sand in desert conditions beneath a solar array, substantial light can be reflected from the surrounding ground surface to the solar modules overhead. Light can also be reflected by the artificial palm fronds to at least partially illuminate the top and bottom surfaces of other adjacent artificial palm fronds including solar cells. In the past, most conventional photovoltaic solar cells have been black or dark blue in coloration, as this was thought to maximize light absorption. However, in some circumstances it is possible for medium and dark green coloration to actually maximize the total light absorption of a solar array when the effect of reflected light as between various artificial leaves or palm fronds is considered. Further, the use of dark blue or black coloration can be associated with higher operating temperatures and this can possibly result in more rapid degradation of an artificial palm frond having a solar module including at least one solar cell over several decades of use.

Figure 9:
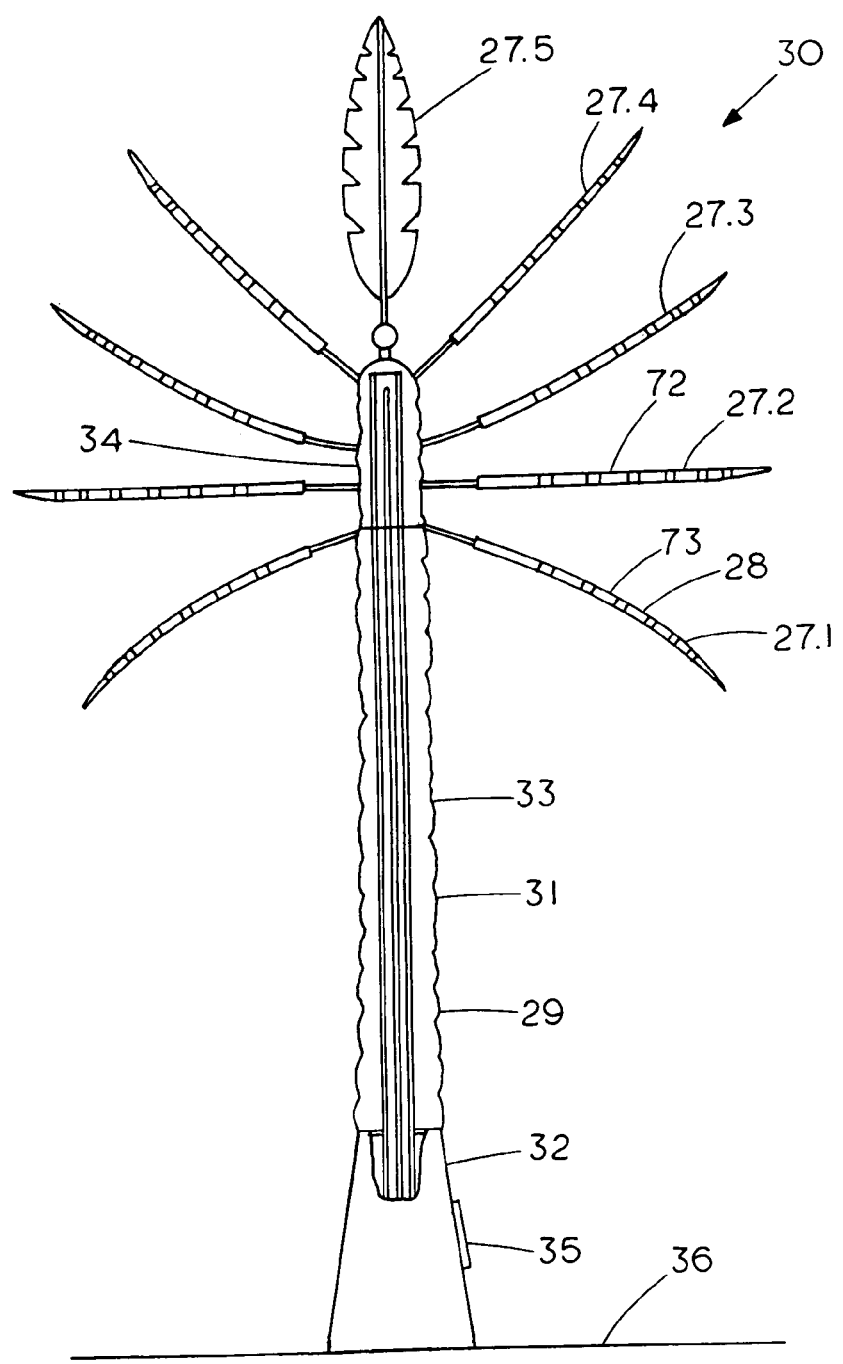
FIG. 9 is a perspective side view of an artificial palm tree that consists of a solar array showing one possible orientation of five layers of artificial palm fronds, each artificial palm frond consisting of a solar module including at least one solar cell.

FIG. 9 is a side perspective view of an artificial palm tree 29 generally similar to the embodiment shown in FIG. 1 forming a solar array 30, and showing the orientation of five layers 27 of artificial palm fronds 72 each including a solar module 28 including at least one solar cell 73. As shown, the artificial palm fronds 72 on the inferiormost first layer 27.1 are orientated downwards at approximately 45 degrees, whereas those on the second layer 27.2 are orientated approximately horizontally. The artificial palm fronds 72 on the third layer 27.3 are orientated upwards at approximately 30 degrees, whereas those on the fourth layer 27.4 are orientated upwards at approximately 45 degrees. The fifth layer 27.5 of artificial palm fronds 72 is orientated upwards between 45 and 90 degrees. The different orientations of these layers and also the staggered placement of the artificial palm fronds 72 can permit the capture of substantial direct light and also reflected light by the solar array 30. The structure and configuration shown in FIG. 9 can also provide a large resulting working area, and tends to minimize counterproductive shading of adjacent artificial palm fronds 72 and solar modules 28.

Figure 10:
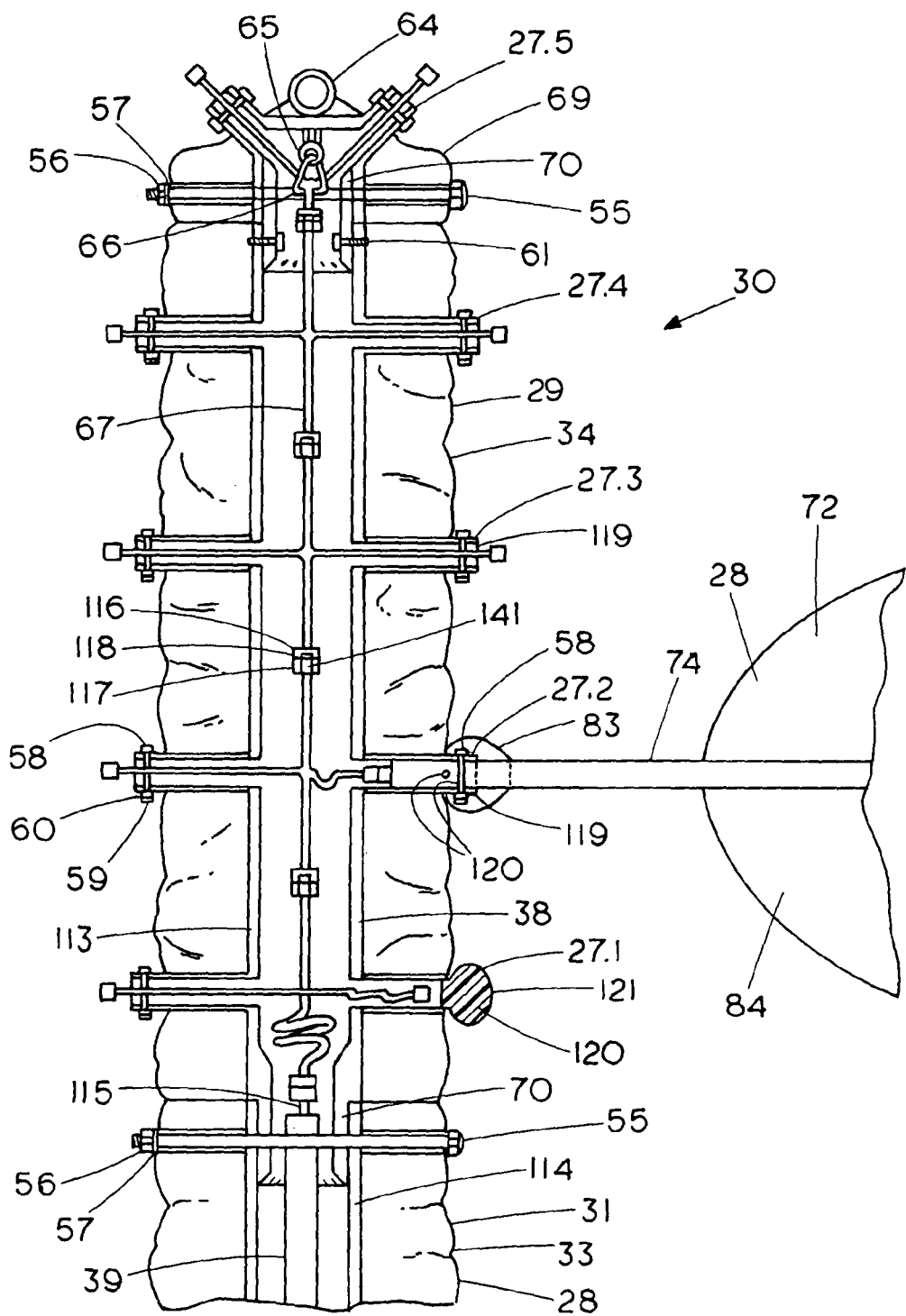
FIG. 10 is a side cross-sectional view of a top portion of a trunk of an artificial palm tree that consists of a solar array including provision for four layers, and also a cap portion showing both internal and external components.

FIG. 10 is a side cross-sectional view of a top portion 34 of the trunk 31 of an artificial palm tree 29 including provision for four layers 27, and also of a cap portion 69 of the trunk 31 of an artificial palm tree 29 including provision for one layer 27.5 showing both internal and external components. The top portion 34 of the trunk 31 includes a top portion 113 of pole 38 that includes a sleeve 70 which can be inserted within the inner diameter of the bottom portion 114 of the pole 38. The sleeve 70 can be made integral to the top portion 113 of the pole 38, or can be secured by mechanical fasteners such as bolts 61, or can be welded thereto. Alternately, a sleeve 70 portion can extend from the bottom portion 114 of pole 38 and instead be received within the inner diameter of the top portion 113 of the pole 38. The sleeve 70 and top portion 113 of the pole 38 can then be further removably secured to the bottom portion 114 of the pole 38 with the use of a long bolt 55, washer 57, and nut 56. When the long bolt 55 is removed, the entire top portion 34 and cap portion 69 of the trunk 31 including a plurality of solar modules 28 can be lifted and removed using a rope or cable which can be attached to the external ring 64 present at the top of the cap portion 69 of the trunk 31. Conversely, the entire top portion 34 and cap portion 69 of the trunk 31 including a plurality of solar modules 28 can be simply lifted and installed using a rope or cable that can be attached to the external ring 64 present at the top of the cap portion 69 of the trunk 31. Accordingly, the process of installing, repairing, or renewing components of a solar array 30 is made fast and easy.

As shown in FIG. 10, the top portion 34 of the trunk 31 includes four layers 27, namely, layers 27.1, 27.2, 27.3, 27.4, and 27.5 of solar modules 28, and each layer 27 can include between five and ten artificial palm fronds 72 including or essentially consisting of solar modules 28. The conduit 39 containing and protecting the electrical wire 115 terminates a short distance from the top of the middle portion 33 of the trunk 31 so as to avoid it possibly becoming damaged during the installation of the top portion 34 of the trunk 31. The electrical wire 115 can include a plug 116 and socket 117 type connector 118 which can include locking means 141 for selectively locking the two subcomponents together so as to prevent accidental disconnection. Likewise, a plurality of electric power cords 67 can be used to connect each layer 27 of solar modules 28 to the other, or alternatively, to simultaneously connect all of the layers 27. The electric power cords 67 can be affixed to an internal ring 65 via a clip 66 and thereby be suspended vertically.

The cap portion 69 of the trunk 31 can also include a sleeve 70, or alternatively, can receive a sleeve 70 for properly positioning and securing the cap portion 69 to the top portion 34 of the trunk 31. The cap portion 69 can then be further removably secured by using a long bolt 55, nut 56, and washer 57. A portion of an artificial palm frond 72 including or substantially consisting of a solar module 28 is also shown in position in FIG. 10. The stem 74 of the artificial palm frond 72 is configured to fit within the inner diameter of the receptacle 119. The stem 74 can then be further secured using a bolt 58, nut 59, and washer 60 which can either serve to clamp the receptacle 119 about the stem 74 of the artificial palm frond 29, or alternatively, and as show in FIG. 10, the bolt 58 can pass through an opening 120 in the stem 74. The stem 74 can be provided with a plurality of alternate openings 120 for possible use so as to permit the selection of a particular orientation of the artificial palm frond 72 during installation, as desired. The wiring connection between the artificial palm frond 72 including the solar module 28 can be made by manual means and the use of twist on wire connectors 53, but as shown in FIG. 10, the wiring connection is preferably made with the use of a plug 116 and socket 117 connector 118 including locking means 141 which is generally similar in structure and function with those used to connect the electrical wire 115 and the electric power cords 67, but being smaller in size. Many different styles and sizes of connectors 118 are commercially available and can be used. A seal 83 can be used to cover and protect the junction of the stem 74 with the receptacle 119, and so prevent the ingress of dirt, water, insects, or rodents which could cause damage to the solar array 30. When not all of the provided layers 27 or receptacles 119 are required or desired for use in a given solar array 30, a plug 121 can be used to seal the opening 120 associated with a receptacle 119.

Figure 11:
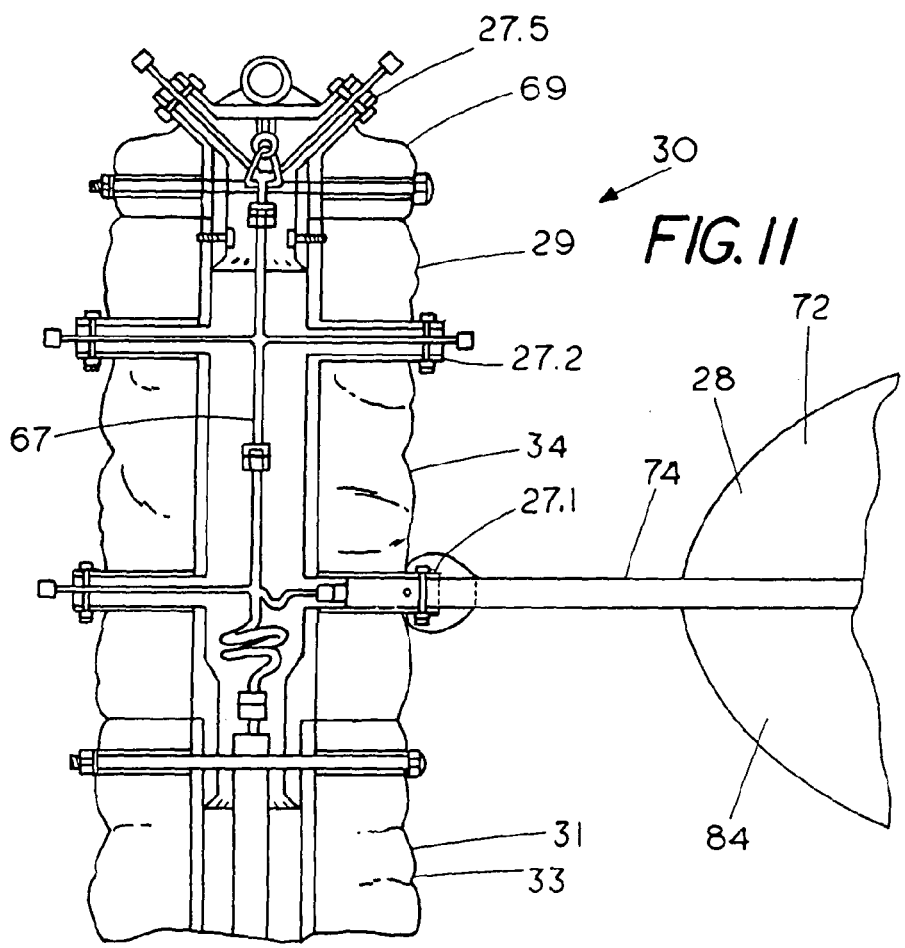
FIG. 11 is a side cross-sectional view of an alternate top portion of an artificial palm tree including provision for two layers showing both internal and external components.

FIG. 11 is a side cross-sectional view of an alternate top portion 34 of the trunk 31 of an artificial palm tree 29 including provision for two layers 27.1 and 27.2, and also a cap portion 69 including provision for one layer 27.5 for use in making a solar array 30 showing both internal and external components. As a result, the top portion 34 of the trunk 31 of an artificial palm three 29 can be removably secured and assembled using a component that includes provision for two layers 27.1 and 27.2, that is, if and when this configuration is desired.

Figure 12:
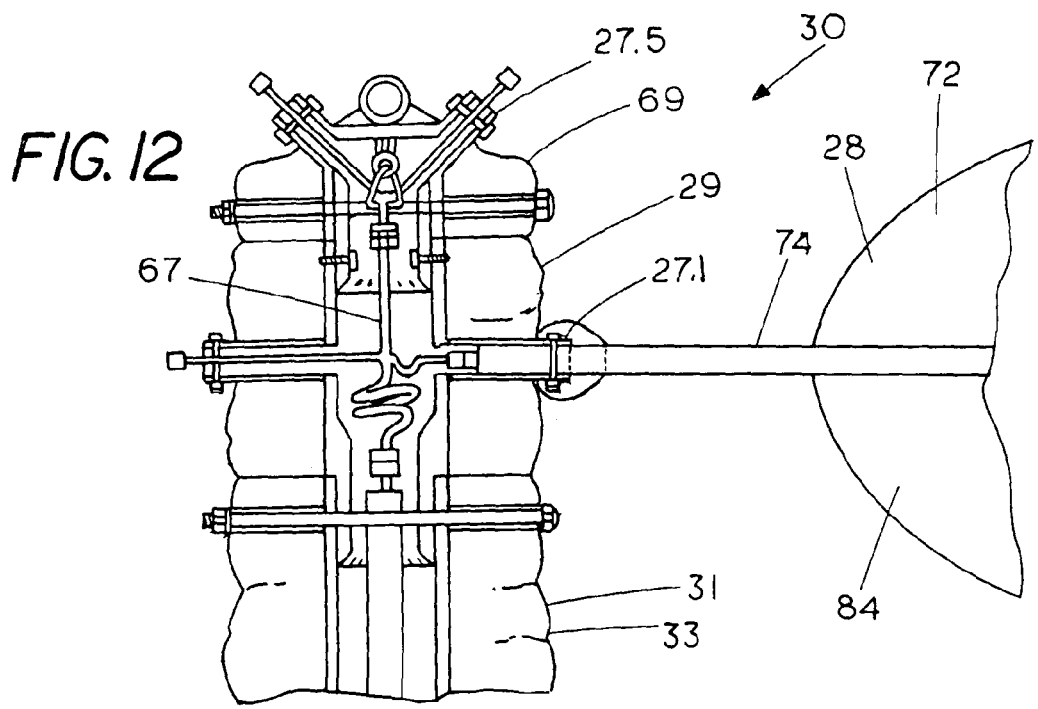
FIG. 12 is a side cross-sectional view of an alternate top portion of an artificial palm tree including provision for one layer showing both internal and external components.

FIG. 12 is a side cross-sectional view of an alternate top portion 34 of the trunk 31 of an artificial palm tree 29 including provision for one layer 27.1 and also a cap portion 69 including provision for one layer 27.5 for use in making a solar array 30 showing both internal and external components. As a result, the top portion 34 of the trunk 31 of an artificial palm three 29 can be removably secured and assembled using a component that includes provision for only one layer 27.1, that is, if and when this configuration is desired. The provision of multiple power cords 67 each providing sufficient wiring for one layer of solar modules 28 which can be easily coupled together can facilitate rapid assembly. The possible provision of alternate top portions 34 in one, two, or four layer 27 configurations makes it possible to easily assemble different resulting structures. Accordingly, the power generating capability and also the aesthetic appearance of a solar array 30 can be customized.

Figure 13:
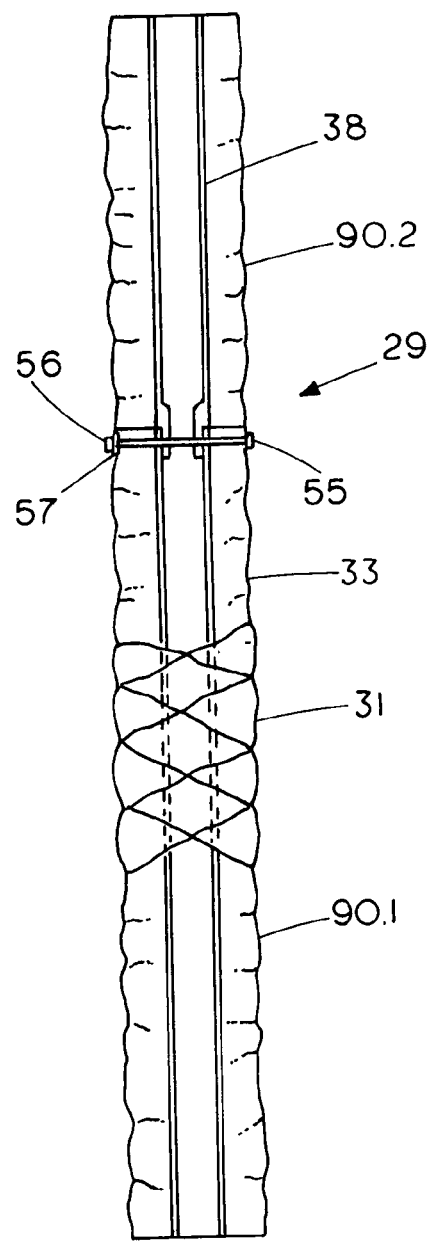
FIG. 13 is a side view with parts broken away of an alternate middle portion of a trunk of an artificial palm tree including at least two sections which can be removably secured together to substantially determine the overall height of an artificial palm tree.

FIG. 13 is a side view of an alternate middle portion 33 of the trunk 31 of an artificial palm tree 29 with parts broken away. The middle portion 33 includes at least two segments or sections 90, and in particular, sections 90.1 and 90.2, which can be removably secured together with the use of a long bolt 55, nut 56 and washer 57 in order to determine the overall height of the resulting trunk 31 of an artificial palm tree 29, as desired. Shown in FIG. 13 is a section 90.1 having a length of eight feet, and another section 90.2 having a length of four feet. Accordingly, multiple sections 90.1 and 90.2 can be easily combined in various partial or complete combinations to create trunks 31 and artificial palm trees 29 having different heights. The configuration and texture of the outer surface of the trunk 31 can be made to resemble that of a palm tree by making the molds for these components from an actual palm tree. The trunk 31 can then be made of plastic, polyurethane, fiberglass, metal, ceramic, and also natural organic and fibrous materials in various combinations.

Figure 14:
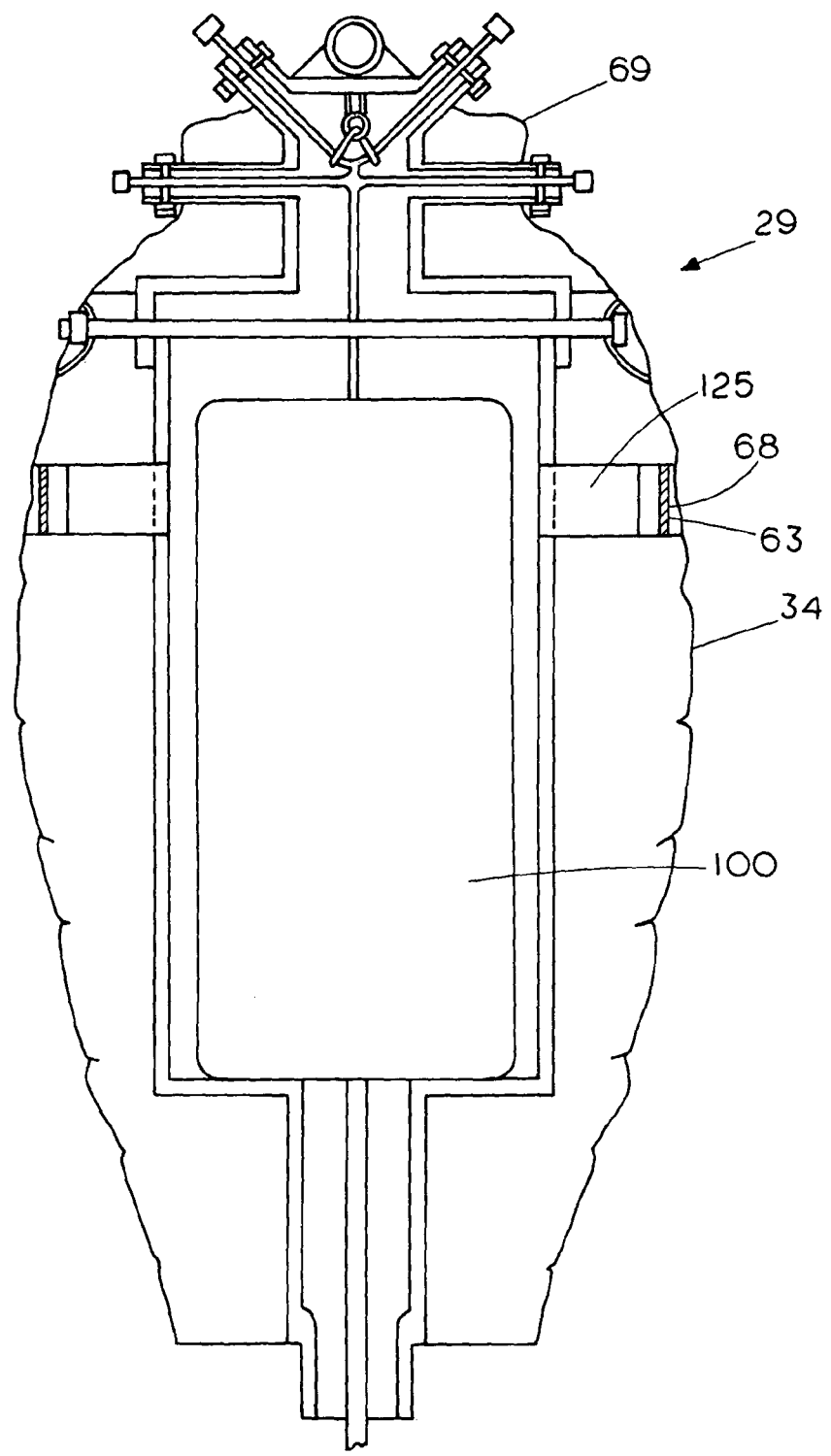
FIG. 14 is a side cross-sectional view of an alternate top portion and cap portion of a trunk of an artificial palm tree for accommodating a transformer.

FIG. 14 is a side cross-sectional view of an alternate top portion 34 and cap portion 69 of a trunk 31 for use in making an artificial palm tree 29. As shown, the top portion 34 and cap portion 69 have greater width that the embodiment shown in FIG. 10, and this can provide space for accommodating and substantially concealing a transformer 100. A step-up transformer can be used to step-up the voltage being generated by the solar array so that it can be more efficiently carried over long distances. Conversely, a step-down transformer can be used to step-down the voltage being carried by a high voltage power line. A transformer can be connected to overhead transmission lines, or alternatively to buried power lines which can carry DC current or AC current. Shown is a duct 125 including a vent 68 having a screen 63 for permitting ventilation while preventing the entry of birds, bees, or other foreign matter.

Figure 15:
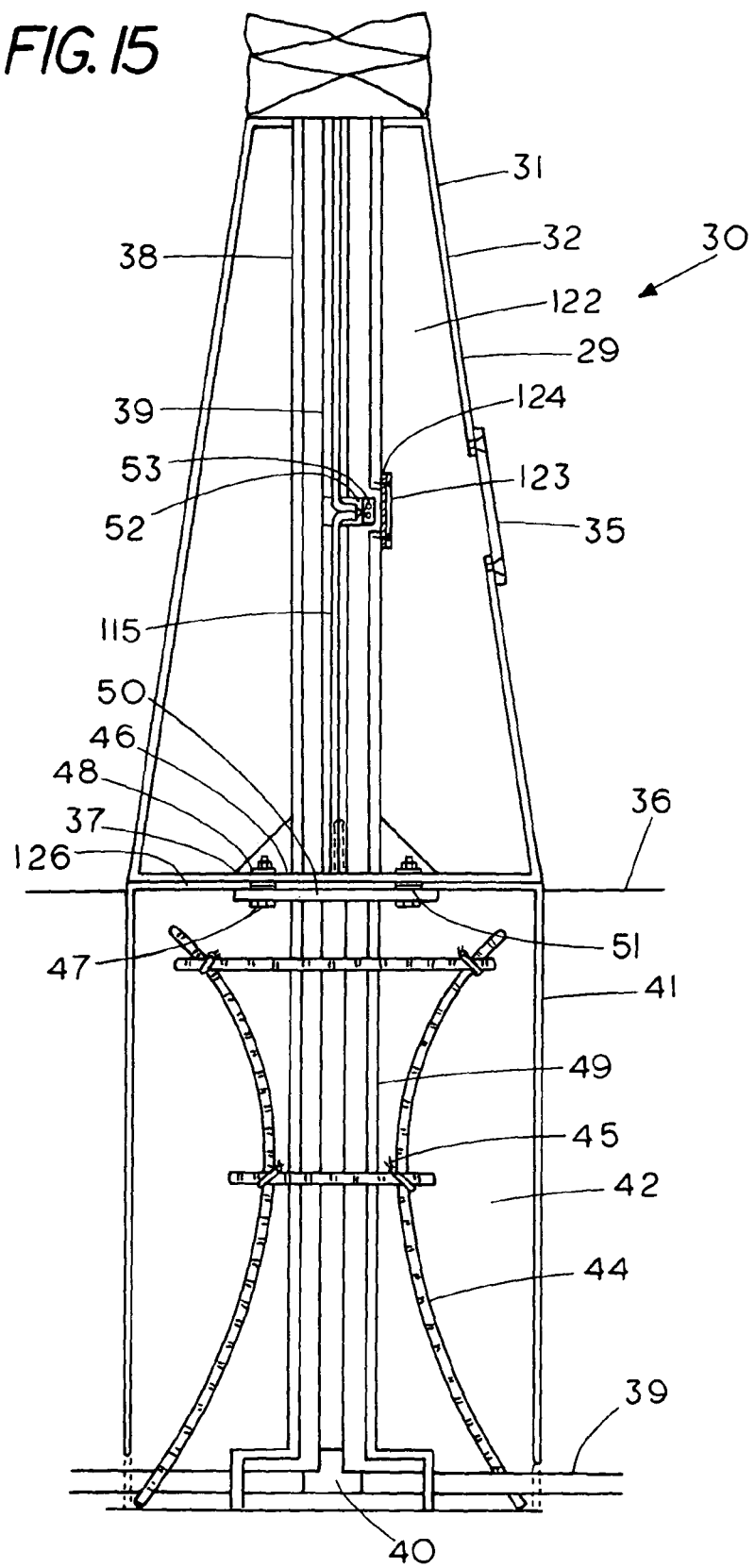
FIG. 15 is a side cross-sectional view of a bottom portion of a trunk and also a footing of an artificial palm tree that consists of a solar array.

FIG. 15 is a side cross-sectional view of the bottom portion 32 of a trunk 31, and also a footing 126 including a support platform 49 for an artificial palm tree 29 that forms a solar array 30 showing both internal and external components. As shown, the bottom portion 32 of the trunk 31 gradually widens as it approaches the ground surface 36, thus simulating the appearance of many palm tree species. The bottom portion 32 of the trunk 31 can include at least one access door 35 to an interior compartment 122. The support pole 38 can further include a cover 123 and a gasket 124 which permits access to a wire connection 52 between the solar array 30 and electric wire 115. The wire connection 52 can be secured by twist on wire connectors 53, or alternatively, by other conventional fastening means such as bolts or screws associated with a junction box 54. The electric wire 115 can be protected from damage by a conduit 39 made of metal or plastic, and in particular, in areas where the soil, insects, or rodents could cause harm or degradation to the wire 115.

The base 37 of the pole 38 includes a reinforced flange 46 that provides several openings for the passage of bolts 47. The base 37 of the pole 38, and in particular, the inferior side of the flange 46 is configured to bear upon a footing 126 which can include a submerged platform 49 including a reinforced flange 50. The vertical alignment of the pole 38 can be adjusted at the junction of flange 46 and flange 50 with the use of one or more washers 51 when the bolts 47 and nuts 48 are secured. The platform 49 can include a stand-off at the inferior side for permitting the conduit 39 and conduit fitting 40 including the electric wire 115 to pass directly beneath, but also to permit the concrete 42 used in the footing 126 to substantially encompass the platform 49. The concrete 42 can be further reinforced by including metal rebar 44 therein. The rebar 44 can be configured as desired and secured with the use of tie wire 45 prior to pouring the concrete 42. A circular hole or pit can be drilled in the ground using power equipment and a circular or tube shaped form 41 can be inserted into the hole or pit for properly containing the concrete 42 when it is poured. It can be readily understood that the particular configuration, structure, and size of a footing 126 can vary depending upon the geology, soil conditions, climate, and seismic characteristics of the installation site.

Figure 16:
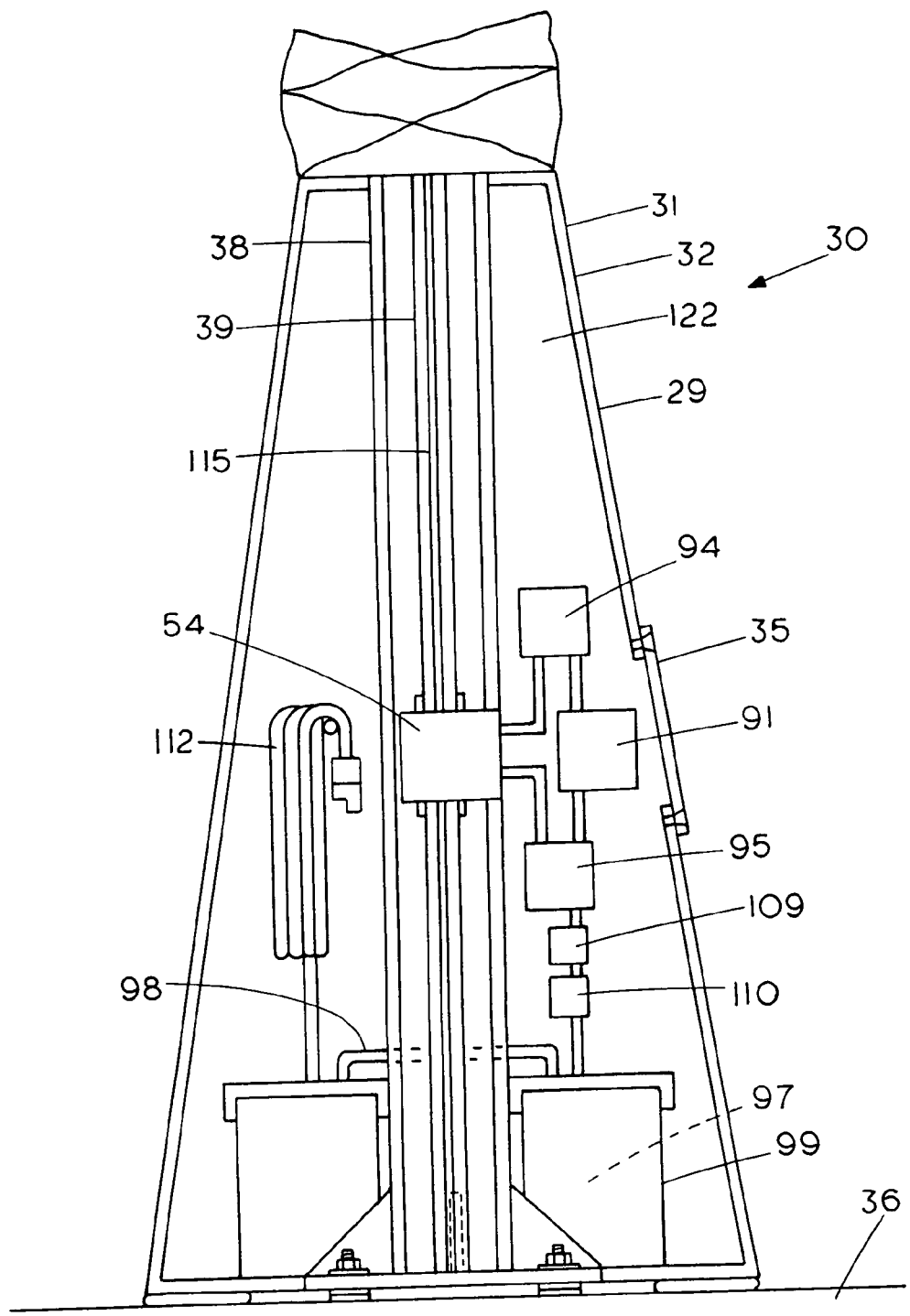
FIG. 16 is a side cross-sectional view of a bottom portion of a trunk of an artificial palm tree generally similar to that shown in FIG. 15, but including additional electrical devices within the interior compartment.

FIG. 16 is a side cross-sectional view of the bottom portion 32 of the trunk 31 and of an artificial palm tree 29 that constitutes a solar array 30 showing both internal and external components generally similar to that shown in FIG. 15. However, instead of the solar array 30 being directly connected by an electric wire 115 to a network of solar arrays and a solar power grid or conventional electric power grid, the solar array 30 further includes a number of devices which can be located internally. In particular, a solar array 30 can include in various partial or complete combinations, an inverter 91 such as a Sunnyboy brand grid-tie inverter made by SMA America, Inc. of Grass Valley, Calif. for converting DC current to AC current, a converter for converting AC current to DC current, a transformer, a battery 97 and associated battery cables 98, a battery box 99, a junction box 54, a control panel, an AC circuit breaker, a DC circuit breaker, an AC disconnect 94, a DC disconnect 95, a meter, a ground fault switch, a power surge protection device, a fuse, a capacitor, a resistor, a transistor, a diode, a chip, a battery controller 109, a battery status meter 110, a generator, conduit 39 including suitable electric wire 115, a retractable extension cord including a plug, a light, an adapter for recharging small batteries, appliances and power tools, and, an electric power recharging cord 112 for recharging a vehicle such as an electric scooter, bicycle, car, boat, or aircraft. The recharging cord 112 can be mounted within the interior compartment 122 of the base 32 on an automatic retractable reel, whereas the end of the recharging cord 112 including the connector 118 can be located externally and be readily accessible for use. It can be readily understood that some of the devices and things recited in this paragraph can be combined in structure and function in the form of hybrid devices.

FIG. 17 is a top perspective view of an access door 35 to the interior compartment 122 of the bottom portion 32 of the trunk 31 of an artificial palm tree 29 which forms a solar array 30: As shown, the access door 35 can include a transparent window 127 on the exterior side 142 for viewing the status of one or more devices such as an inverter 91, a meter, an AC disconnect, a DC disconnect, a battery controller 109, and a battery status meter 110. A battery controller 109 can be used to prevent overcharging of a battery, and also to reverse electric power flow at night. As shown, the visual display 158 associated with these electronic devices, and the like, can be mounted near or directly to the interior side 143 of the access door 35, whereby these devices can be easily viewed and serviced. As shown, the access door can included a keyed lock 145, or other closure and locking means.

FIG. 18 is a perspective view of a grid-tie power center 151 which could be used in a typical residential installation in combination with one or more solar arrays 30 resembling natural foliage according to the present invention. Shown is an inverter 91 for converting DC current to AC current, an AC disconnect 94, a DC disconnect 95, a meter 93, a control panel 108 including circuit breakers 144, and conduit 39 containing suitable wire 115. A grid-tie power center 151, or alternately an off-grid power center, can also include or integrate in various partial or complete combinations a battery and associated battery cables, a battery box, a battery status meter, a battery controller, a ground fault switch, a surge protector, a converter, a transformer, an extension cord, a light, a generator, an adapter for recharging small batteries, appliances, and power tools, and an electric power recharging cord for recharging a vehicle such as an electric scooter, bicycle, car, or boat.

FIG. 19 shows a row 128 of artificial palm trees 29 that consist of solar arrays 30 on one side of a street 85. The solar arrays 30 have a structure configured to resemble natural foliage and can be placed in communication to create a network 153 of solar arrays 30 that constitute at least a portion of a solar power grid 154. Further, the solar arrays 30 can be individually connected to power transmission lines associated with a power grid. Alternatively, a plurality of solar arrays 30 can be connected together, and then connected as a group to power transmission lines. The solar arrays 30 can be wired together in series, or alternately in parallel. When a plurality of solar arrays 30 are wired together for connecting to an AC power grid, a grid-tie inverter can be used. The artificial palm trees 29 are aesthetically more pleasing than conventional overhead power lines, and also the sparse vegetation found by the sides of roads and highways in the Southwest area of the United States and other arid regions of the world. The artificial palm trees 29 are shown near a curb 86 and adjacent sidewalk 87. Besides providing clean and renewable electric power, the solar arrays 30 can also provide shade and serve as a windbreak. Unlike natural foliage which is difficult to maintain by the sides of roads and highways in the Southwest area of the United States and other arid regions of the world, an artificial palm tree 29 always has a healthy appearance, never needs watering, and requires little maintenance. In desert areas, the shade provided by artificial palm trees 29 can be used to facilitate the cultivation of natural foliage and agriculture. A network of solar arrays 30 can also be positioned along canals and pipelines. The power produced by a solar array 30 can be used to pump oil, or water, and also to desalinate and filter water for residential and agricultural use. Solar water heating devices such as those made by Maltezos SA of Athens, Greece can then be used to provide hot water. Solar arrays 30 can also be positioned alongside railways for providing power for electric trains. The ability to generate and distribute power where it is actually needed can result in logistical and economic efficiency. In this regard, the location, pattern, and density of public roads and highways generally well reflects the local population density and demand for energy. Accordingly, the creation of a network 153 of solar arrays 30, and at least one solar power grid 154 alongside public roads can be consistent with the local economy of scale.

FIG. 20 shows a row 128 of artificial palm trees 29 that consist of solar arrays 30 located on both sides of a street 85. The solar arrays 30 have a structure configured to resemble natural foliage and can be linked together to create a network 153 of solar arrays 30 and a solar power grid 154. FIG. 20 conveys some sense of the structure and aesthetic impression created by a network 153 including a plurality of solar arrays 30.

FIG. 21 is a top plan view of a section of interstate highway 129 showing one possible configuration of a plurality of artificial palm trees 29 consisting of solar arrays 30 positioned in staggered double rows 128 on each side of the highway 129. The solar arrays 30 have a structure configured to resemble natural foliage and can be linked together to create a network 153 of solar arrays 30 and a solar power grid 154. In FIG. 21, the opposite lanes 152 of the interstate highway 129 each have two shoulders 147, and are separated by a center divider or barrier 146. Further, the topography to the outside of both lanes 152 of the interstate highway 129 is characterized by gradually increasing vertical elevation and hills 157. Many other landscapes, topographical characteristics, and configurations are possible. As shown, the artificial palm trees 29 are positioned approximately thirty-two feet apart in each row 128, and the two rows 128 are also separated by thirty-two feet. Other dimensions can be used, as desired, but it can be advantageous to provide sufficient spacing to prevent substantial shading of adjacent solar arrays 30. The height, diameter, and composition of the artificial palm trees 29 can be varied, and other styles and types of artificial foliage consisting of alternative solar arrays can be used in synergistic combination with the artificial palm trees 129, or alternatively, with evergreen or deciduous trees, as may be desired. Accordingly, many combinations and permutations are possible. The ability to provide a large number of different combinations can be functional from the standpoint of optimizing power generation, and can also serve aesthetic purposes consistent with the best practices of engineering and landscape architecture.

Moreover, the present invention anticipates and teaches making various planning models for application to common road configurations regarding the installation of solar arrays, and also recharging stations. For example, various standardized models can be created for installations alongside relatively straight one mile stretches or other standard distances such as one kilometer stretches of two lane, divided two lane, divided four lane, divided three lane, and other common road and highway configurations. Appropriate models can also be made for various common intersections such as four way intersections, T shaped intersections, L shaped intersections, turnabouts, and various on and off ramp configurations associated with roads and highways. Accordingly, the planning for various installations can be made relatively fast and easy, and both the costs and electrical power generated by any selected set of options can be known with a great degree of certainty. A city, county, state, or federal planner, or an elected official such as a commissioner, mayor, governor, representative, or senator can then be empowered with accurate information for decision making concerning the installation of a network of solar arrays, recharging stations, and other devices and structures associated with a solar power grid.

Figure 22:
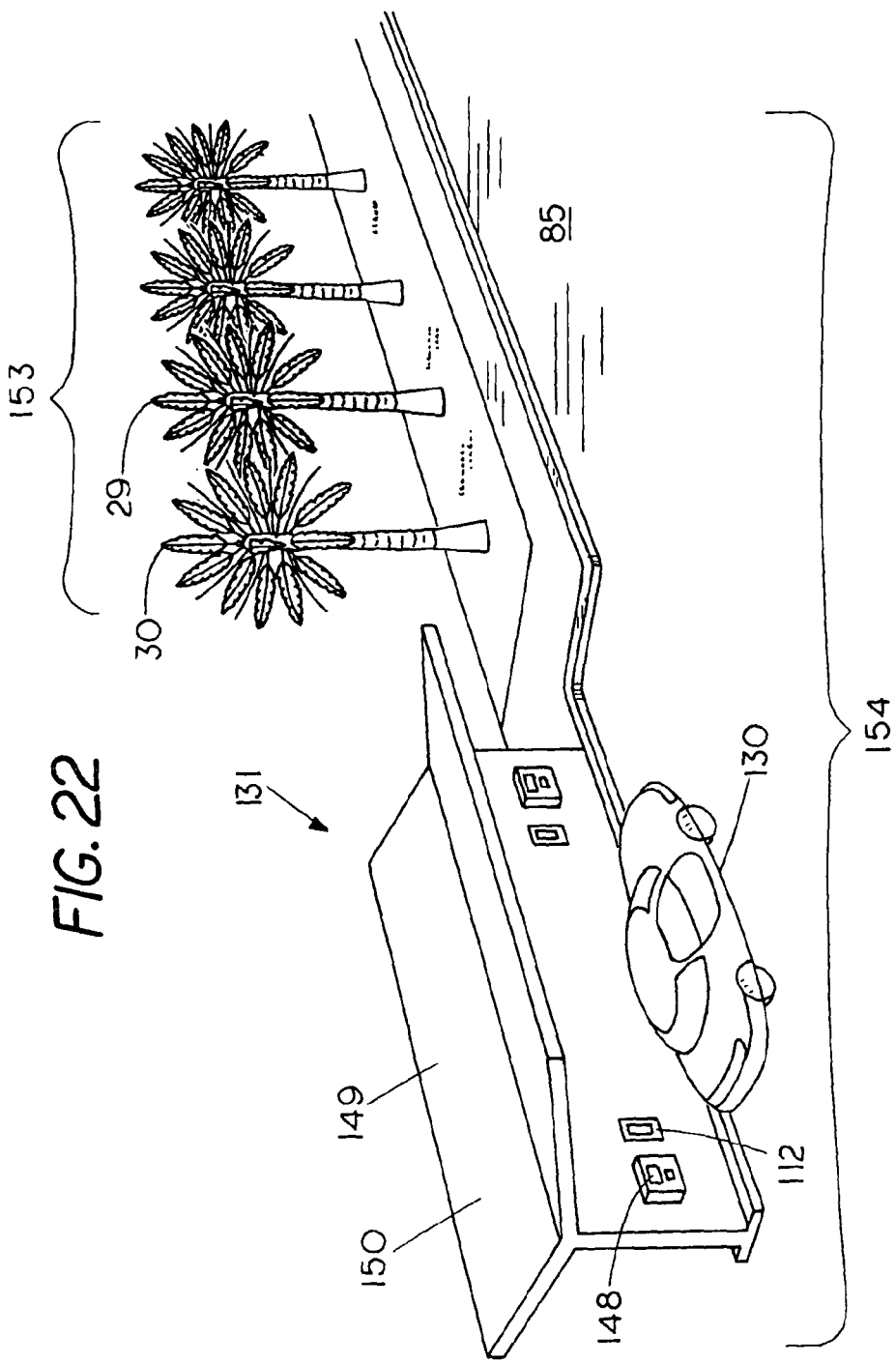
FIG. 22 is a side perspective view of an electric or hybrid automobile parked at an electric recharging station by the side of a road.

FIG. 22 is a perspective view of an electric or hybrid automobile 130 that is parked at an electric recharging station 131 by the side of a street. The roof 150 of the recharging station can include conventional photovoltaic solar panels 149. Manufacturers of conventional photovoltaic solar panels 149 include Kyocera Solar, Inc. of Scottsdale, Ariz., Sharp Electronics Corporation, Inc. of Mahwah, N.J., Evergreen Solar of Marlboro, Mass., BP Solar of Linthicum, Md., and Shell Solar of Camarillo, Calif. The recharging station 131 can serve as an energy storage facility, and can be in communication with electric power which is produced by a network 153 of artificial palm trees 29 or other forms of artificial foliage which constitute solar arrays 30. The solar arrays 30 can line the sides of at least one street, or a nearby highway. The network 153 of solar arrays 30 and recharging station 131 can form or be in communication with one or more solar power grids 154. Moreover, a solar power grid 154 can be linked to one or more conventional power grids.

Figure 23:
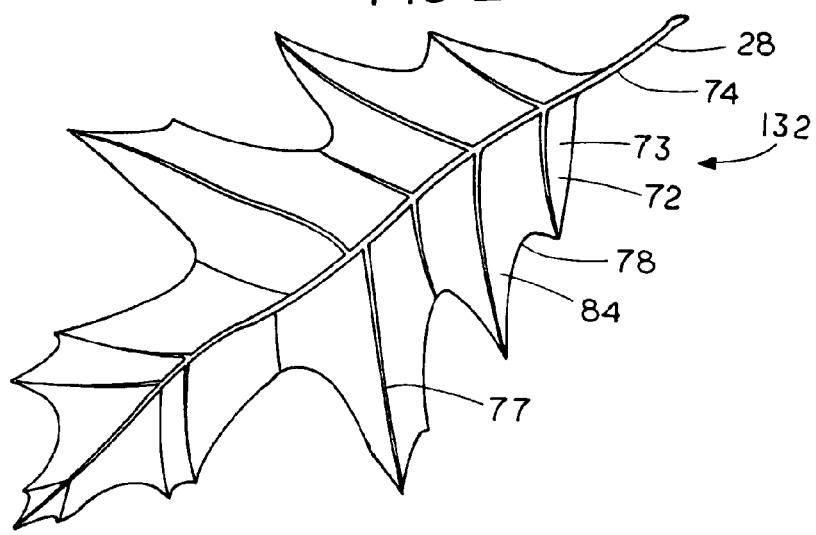
FIG. 23 is a top view of an artificial oak leaf for use with an artificial deciduous oak tree that consists of a solar array.

FIG. 23 is a top view of an artificial oak leaf 132 for use with an artificial deciduous oak tree 135 which consists of a solar array 30. The artificial oak leaf 132 can include a solar module 28 having at least one solar cell 73. As shown, the artificial oak leaf 132 can include a stem 74, a blade portion 84, notches 78 and veins 77.

Figure 24:
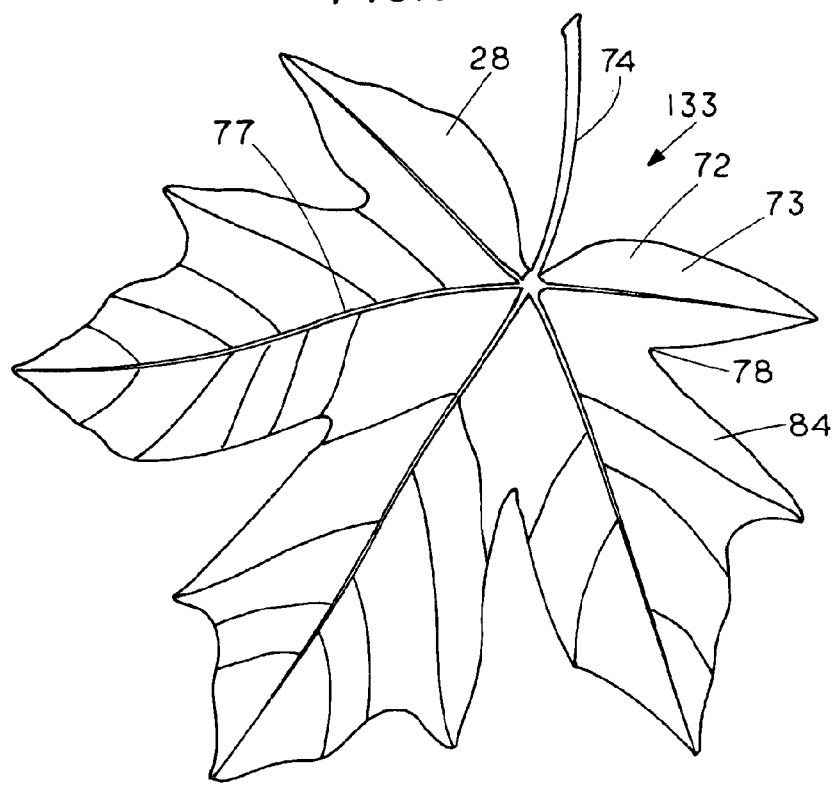
FIG. 24 is a top view of an artificial maple leaf for use with an artificial deciduous maple tree that consists of a solar array.

FIG. 24 is a top view of an artificial maple leaf 133 for use with an artificial deciduous maple tree 136 which consists of a solar array 30. The artificial maple leaf 133 can include a solar module 28 having at least one solar cell 73. As shown, the artificial maple leaf 133 can include a stem 74, a blade portion 84, notches 78 and veins 77.

Figure 25:
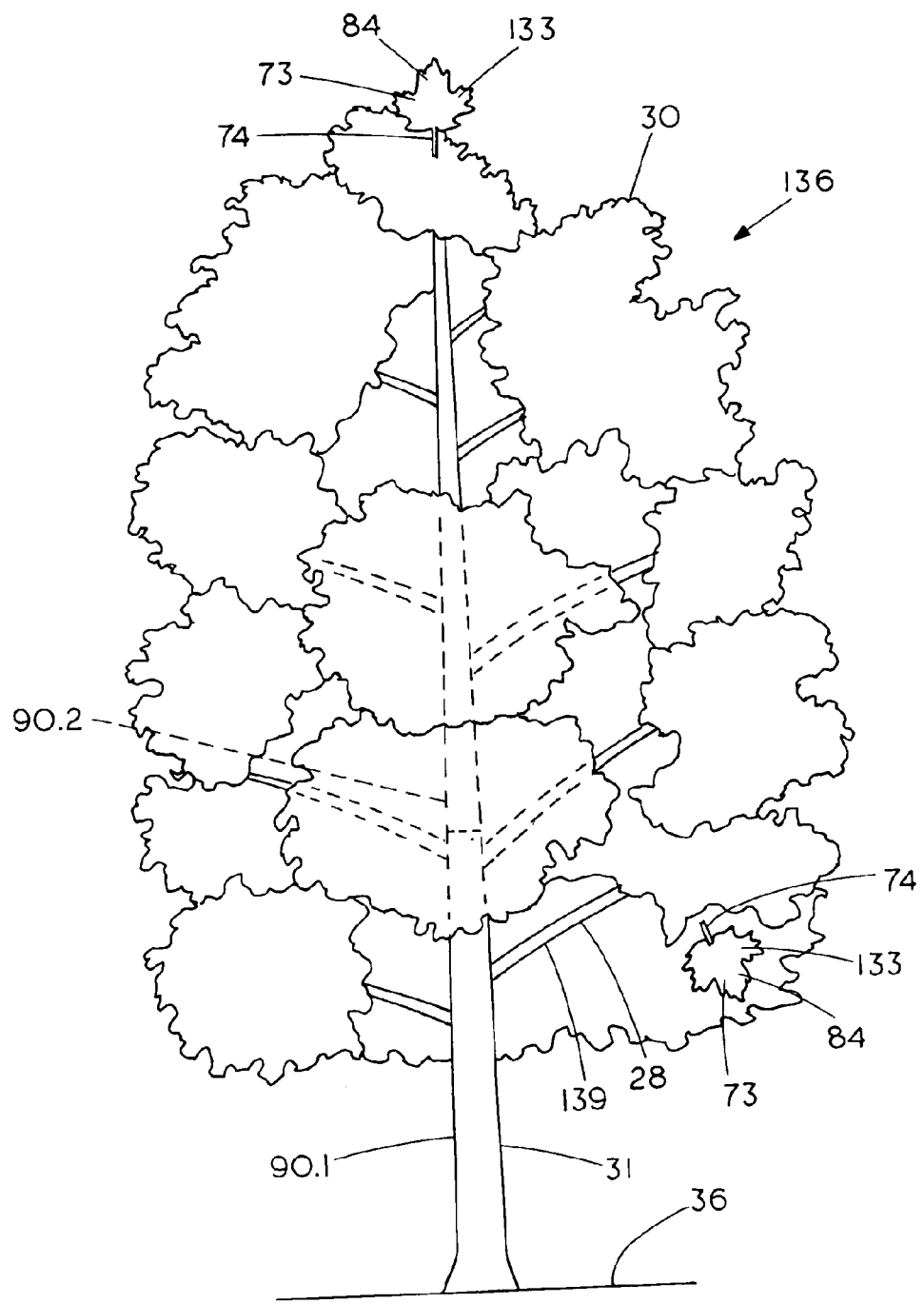
FIG. 25 is a side perspective view of an artificial deciduous maple tree that consists of a solar array.

FIG. 25 is a side perspective view of an artificial deciduous maple tree 136 which consists of a solar array 30. The artificial maple tree 136 includes a trunk 31 and a plurality of artificial branches 139 which include a plurality of artificial maple leaves 133. Again, the artificial maple leaves 133 can include a solar module 28 having at least one solar cell 73. The trunk 31 can be made in a plurality of sections having different lengths such as sections 90.1 and 90.2, and the height of an artificial maple tree 136 can then be varied, as desired.

Figure 26:
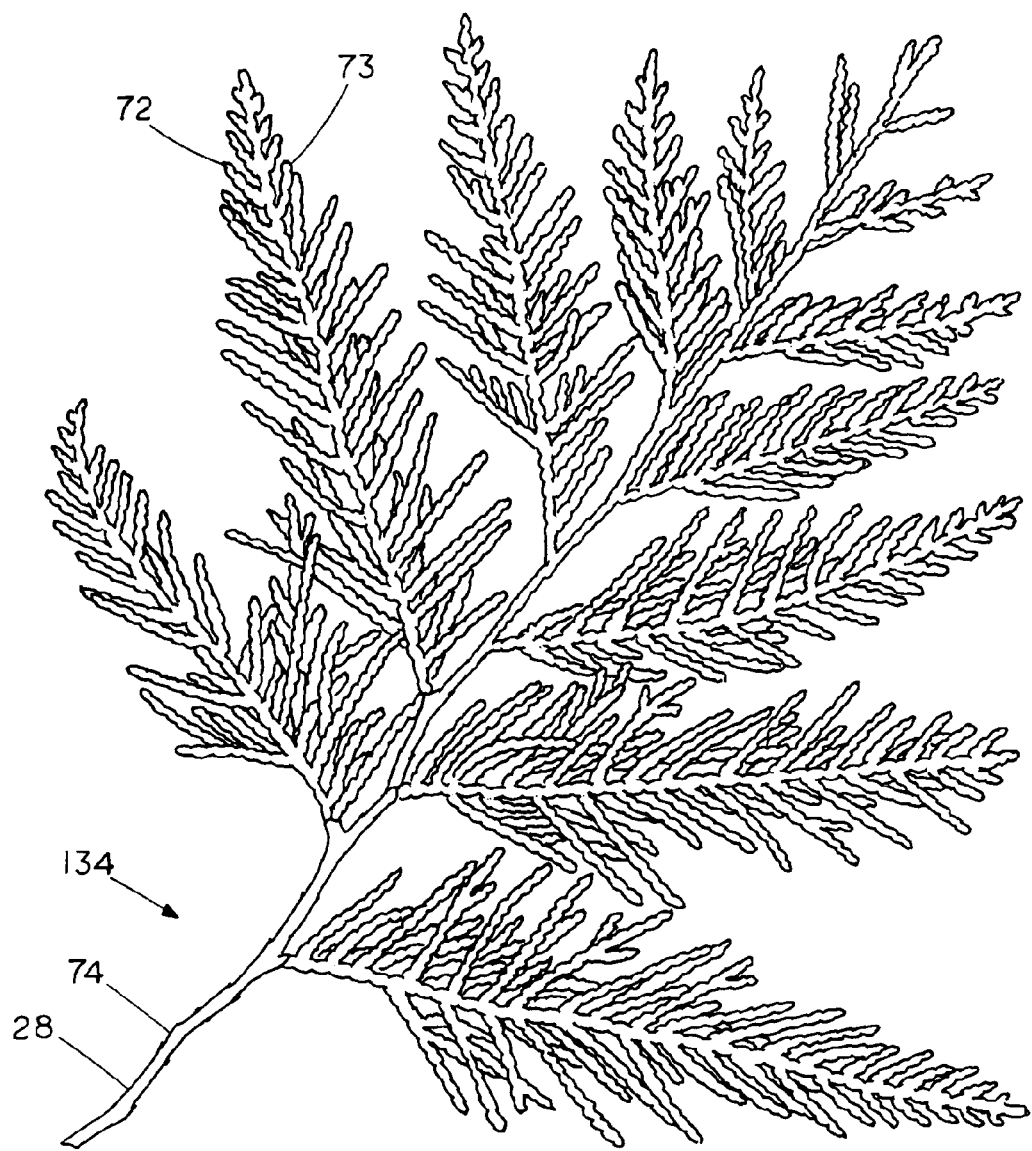
FIG. 26 is a top view of a portion of an artificial evergreen tree branch and leaf for use with an artificial evergreen tree that consists of a solar array.

FIG. 26 is a perspective view of a portion of an artificial branch 139 including leaves 134 for use with an artificial evergreen tree 137 that consists of a solar array 30. The artificial leaf 134 can include a solar module 28 having at least one solar cell 73. As shown in FIG. 26, the branches 139 and leaves 134 can be made to resemble those of a western red cedar or sequoia. It is possible to use conventional molding and cutting techniques to make at least a portion of an artificial branch 139 including leaves 134.

Figure 27:
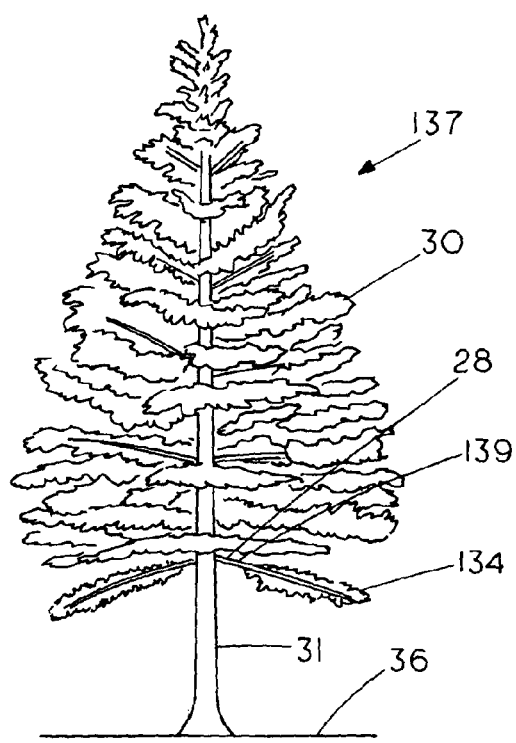
FIG. 27 is a side perspective view of an artificial evergreen tree that consists of a solar array.

FIG. 27 is a side perspective view of an artificial evergreen tree 137 such as a western red cedar which consists of a solar array 30. The leaves or needles of the cedar tree and also sequoias are relatively planar, and in particular, when compared with the leaves or needles of many other evergreen trees. In this regard, the leaves or needles of a cedar tree have the appearance of having been pressed. Gravity then causes the leaves and branches of cedar trees to drape and take on a soft random feathered appearance. Because of the relatively planar configuration of their leaves, it is possible to made artificial branches and leaves 134 resembling those of the western red cedar and sequoia. The leaves 134 can include a solar module 28 including at least one thin-film solar cell 73, or alternatively one made by painting, or other coating process.

Figure 28:
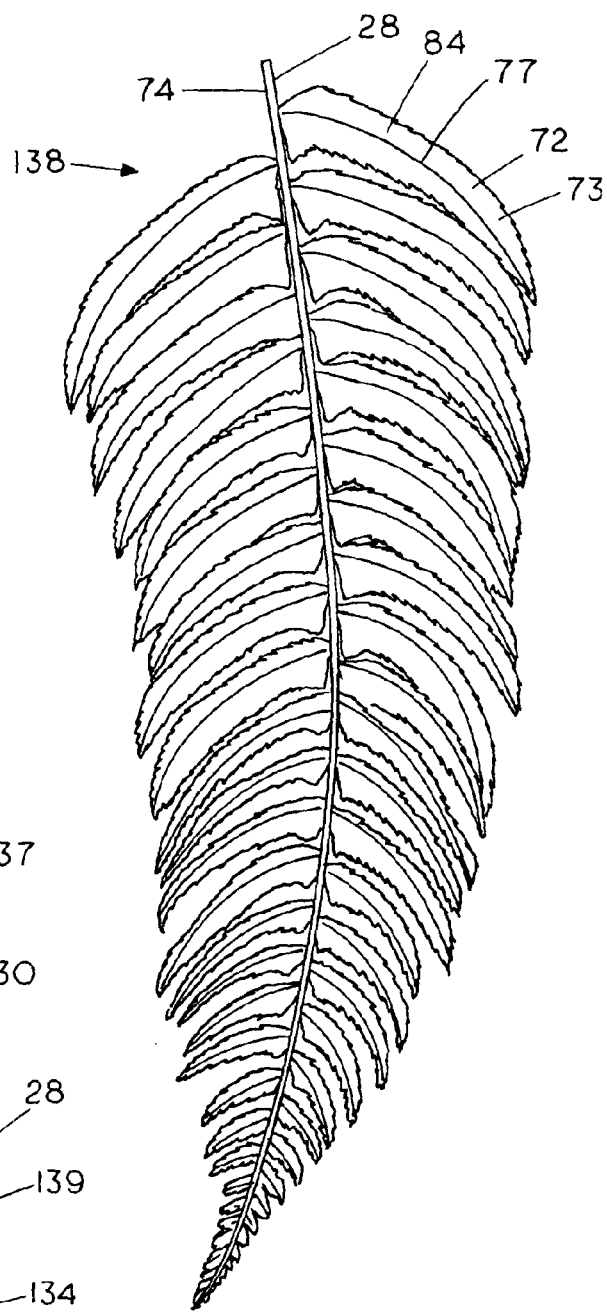
FIG. 28 is a top view of an artificial fern leaf for making an artificial fern plant consisting of a solar array.

FIG. 28 is a top view of an artificial fern leaf 138 for making an artificial fern plant. The artificial fern leaf 138 can include a solar module 28 having at least one solar cell 73. As shown, the artificial fern leaf 138 can include a stem 74, a blade portion 84 including notches 78, and veins 77.

Figure 29:
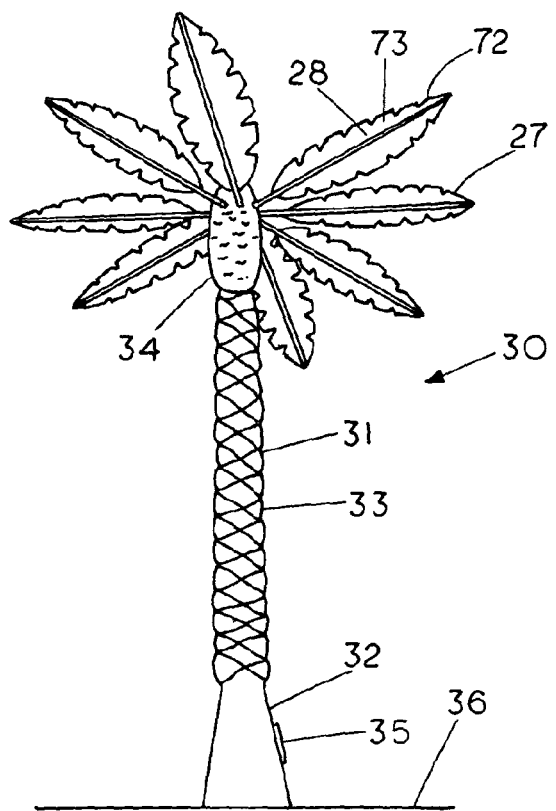
FIG. 29 is a side perspective view of an artificial palm tree that consists of a solar array including a plurality of artificial palm fronds that consist of solar modules.

FIG. 29 is a side perspective view showing an artificial palm tree 29 which consists of a solar array 30. In this embodiment, the leaves or artificial palm fronds 72 can include a solar module 28 made of a relatively rigid material including monocrystalline silicon, polycrystalline silicon, crystalline gallium arsenide, and the like. The artificial palm fronds 72 can be relatively rigid and the solar modules 28 including at least one solar cell 73 can then be affixed to a relatively rigid substrate. In this regard, glass reinforced plastics, ceramics, or metal materials such as aluminum or stainless steel can be used. Using conventional photovoltaic solar cells 73 that are presently commercially available, the solar modules 28 and solar array 30 shown in FIG. 29 can have an efficiency of approximately 14-16 percent. However, given the status of current research and development efforts in the solar industry something exceeding 35 percent efficiency may be possible to achieve within the next decade. For example, Spectrolab of Sylmar, Calif., a subsidiary of The Boeing Company has achieved an efficiency of 36.9 percent with a photovoltaic cell. Given the commercial products available today, the efficiency of a solar cell made using a crystalline silicon material is then nearly three times that of one made using amorphous thin-film materials which commonly enjoy an efficiency of only 5-6 percent. However, the former solar cells are more expensive and less environmentally friendly to manufacture relative to the latter.

As shown in FIG. 29, a solar array 30 can have eight artificial palm fronds 72 including solar modules 28 each having a working area of 18 square feet. Accordingly, the solar array 30 has a total working area of about 144 square feet, or approximately two square meters. Given an efficiency of 15 percent, the solar array 30 will produce about 300 watt-hours, thus about 2.4 kilowatt-hours during an eight hour period. However, given an efficiency of 35 percent, such a solar array 30 would produce about 700 watt-hours, thus about 5.6 kilowatt-hours during an eight hour period. In comparison, the model discussed previously of a solar array made using some thirty-two artificial palm fronds including solar modules having solar cells consisting of an amorphous thin-film material, and in particular, R15-1200 Powerfilm® made by Iowa Thin Film Technology, Inc. enjoyed a working surface area of 192 square feet and could produce 4.6 kilowatt-hours during an eight hour period.

Figure 30:
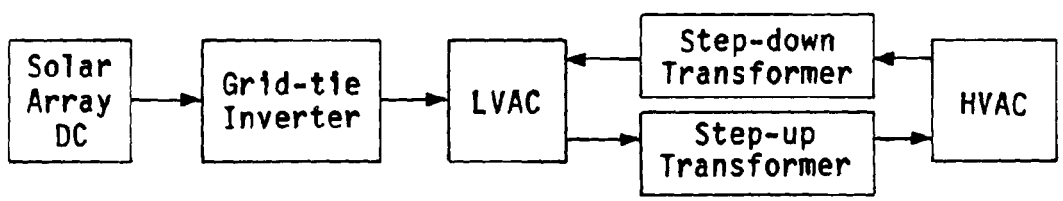
FIG. 30 is a flow diagram showing a solar array in communication with a grid-tie DC to AC inverter that is in communication with low voltage AC power transmission lines associated with an AC power grid.

FIG. 30 is a flow diagram showing a solar array 30 linked to a grid-tie inverter for changing DC current to AC current, and then also to a low voltage AC (LVAC) power transmission line associated with a conventional AC power grid. The AC power grid can further include step-up transformers for creating high voltage AC (HVAC) current from low voltage AC current for long distance distribution. Further, the AC power grid can further include step-down transformers for converting high voltage AC power to low voltage AC power. Many other devices and means are also commonly used to generate and control electric power within a power grid, including but not limited to generators, capacitors, combiners, inductors, shot reactors, transformers, breakers, means for balancing power swings such as a static var compensator, thyristors, a thyristor-controlled series capacitor, and the like. Power coming into a residence in the United States is normally 120 volts (V) or 220 V AC at a frequency of 60 cycles per second, whereas local distribution lines commonly carry voltages of 6.9 kilovolts (kV), 13.8 kV, 27.6 kV, 44 kV, and high voltage AC transmission lines can be at 115 kv, 230 kV, or 500 kv.

Figure 31:
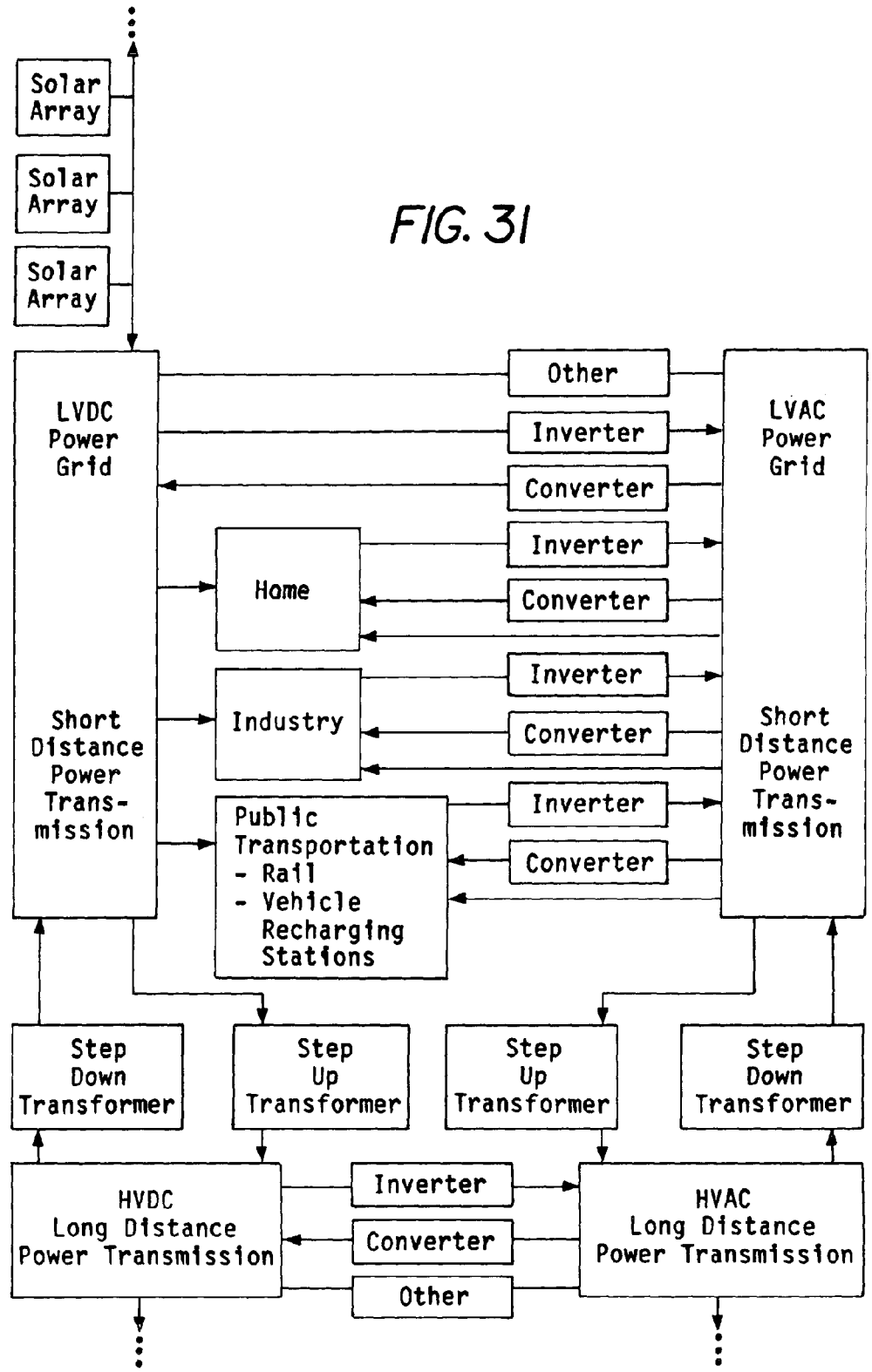
FIG. 31 is a flow diagram showing a solar array in communication with low voltage DC power transmission lines associated with a DC solar power grid.

FIG. 31 is a flow diagram showing a network of solar arrays which form at least a portion of a solar power grid. As shown, the solar arrays can transmit power using low voltage DC (LVDC) lines. The DC solar power grid can be linked to an AC power grid. Inverters can be used to change DC to AC current, and converters can be used to change AC to DC current. Step-up transformers can be used to change low voltage DC current to high voltage DC current (HVDC), or low voltage AC current (LVAC) to high voltage AC current (HVAC). Conversely, step-down transformers can be used to change HVDC to LVDC, or HVAC to LVAC. Many other devices and means are also commonly used to generate and control electric power within a power grid. Given the technology which is available at the present time and at distances greater than 500 miles, high voltage DC power is less expensive to transmit than high voltage AC power. Low voltage DC power can generally be transmitted as inexpensively as AC power for a distance of 50 km when buried underground, and also for a distance of 600-800 km when transmitted by overhead power lines. If the power being produced by the solar arrays will primarily be used locally, then the use of low voltage DC power can indeed be efficient. Various DC combiners and converters can be used with a DC solar power grid.

Further, it is anticipated that low voltage DC power created by a network including a plurality of solar arrays can be changed using a step-up transformer to create high voltage DC (HVDC) current which can be efficiently transmitted long distances using superconductors.

While the above detailed description of the invention contains many specificities, these should not be construed as limitations on the scope of the invention, but rather as exemplifications of several preferred embodiments thereof. Although the present invention has been described with reference to preferred embodiments, workers skilled in the art will recognize that changes may be made in form and detail without departing from the spirit and scope of the invention. Accordingly, the scope of the invention should be determined not by the embodiments discussed or illustrated, but by the appended claims and their legal equivalents.

What is claimed is:

1. A solar array comprising:
   a structure configured to resemble a palm tree comprising a trunk portion and at least one solar module configured to resemble a palm frond, said at least one solar module comprising one or more solar cells each having a working surface area configured to capture sunlight and to output electrical energy,
   said structure being coupled via one or more electrically conductive elements with a plurality of additional structures also being configured to resemble a palm tree and having one or more solar modules,
   said structure and said plurality of additional structures being intermittently disposed in at least one row along the periphery of a road to form a network of structures configured to output said electrical energy via said one or more electrically conductive elements to at least one recharging station configured to selectively provide said electrical energy to electric power storage devices of transportation vehicles which selectively couple with said at least one recharging station,
   said network of structures and said at least one recharging station together forming an independent solar power grid.

2. The solar array of claim 1, wherein each of said network of structures further comprises at least one mechanical fastener configured to secure said at least one solar module in a desired orientation relative to said trunk.

3. The solar array of claim 1, wherein said at least one recharging station comprises an electric power cord including a connector for selectively conducting said electrical energy to said electric power storage devices of transportation vehicles.

4. The solar array of claim 1, wherein said at least one row is positioned within a median of said road.

5. The solar array of claim 1, wherein said at least one solar module comprises a stem portion and a blade portion, said stem portion extending from said trunk portion; and
   wherein said one or more solar cells are positioned on said blade portion.

6. The solar array of claim 1, wherein each of said network of structures comprises a support pole coupled with said trunk portion.

7. The solar array of claim 1, wherein said trunk portion comprises an interior compartment.

8. The solar array of claim 1, further comprising at least one electrical device including a visual display.

9. The solar array of claim 1, further comprising a battery operationally coupled with said network of structures.

10. The solar array of claim 1, further comprising at least one electronic component selected from the group of electronic components consisting of a diode, a capacitor, an inductor, a sensor, a controller, a chip, and a transistor.

11. The solar array of claim 1, further comprising an inverter adapted to modify DC current to AC current.

12. The solar array of claim 1, further comprising a converter adapted to modify AC current to DC current.

13. The solar array of claim 1, further comprising a transformer coupled with said at least one solar module.

14. The solar array of claim 1, wherein said independent solar power grid is operationally coupled with a conventional power grid.

15. The solar array of claim 1, wherein said at least one row comprises a first row positioned along a first side of said road and a second row positioned along a second side of said road.

16. The solar array of claim 1, further comprising an electrical power storage apparatus operationally coupled with said at least one recharging station.

17. The solar array of claim 1, wherein said at least one solar module has a green coloration.

18. The solar array of claim 1, wherein the coloration of a portion of at least one of said at least one solar module and said trunk portion is varied so as to create a substantially natural appearance.

19. The solar array of claim 5, wherein said trunk portion comprises a plurality of receptacles for receiving and coupling with the stem portions of said at least one solar module, said plurality of receptacles providing points of access to said one or more electrically conductive elements.

20. The solar array of claim 1, wherein said at least one recharging station comprises:
   a vending machine having a recharging cord configured to be selectively connected to said electric power storage devices of transportation vehicles, such that said vending machine is configured to selectively provide said electrical energy to said electric power storage devices.

* * * * *